(12) United States Patent
Choi et al.

(10) Patent No.: US 11,342,401 B2
(45) Date of Patent: May 24, 2022

(54) SEMICONDUCTOR DEVICE AND METHOD FOR FABRICATING THE SAME

(71) Applicant: Samsung Display Co., Ltd., Yongin-si (KR)

(72) Inventors: Ji Eun Choi, Seoul (KR); Deok Hoi Kim, Seongnam-si (KR); Jeong Hwan Kim, Cheonan-si (KR); Jong Baek Seon, Yongin-si (KR); Jun Cheol Shin, Asan-si (KR); Jae Hak Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/839,796

(22) Filed: Apr. 3, 2020

(65) Prior Publication Data
US 2021/0013280 A1 Jan. 14, 2021

(30) Foreign Application Priority Data
Jul. 9, 2019 (KR) .......................... 10-2019-0082715

(51) Int. Cl.
H01L 27/32 (2006.01)
H01L 51/00 (2006.01)
(Continued)

(52) U.S. Cl.
CPC ...... H01L 27/3262 (2013.01); H01L 27/3248 (2013.01); H01L 27/3265 (2013.01);
(Continued)

(58) Field of Classification Search
CPC ............. H01L 27/3262; H01L 27/3248; H01L 27/3265; H01L 27/3272; H01L 27/1225;
(Continued)

(56) References Cited

U.S. PATENT DOCUMENTS

2013/0168666 A1* 7/2013 Yan ..................... H01L 27/1225
257/43
2015/0053935 A1* 2/2015 Gupta ................. H01L 27/1251
257/40
(Continued)

FOREIGN PATENT DOCUMENTS

KR 10-2015-0051824 A 5/2015
KR 10-2017-0061776 A 6/2017
KR 10-2018-0031861 A 3/2018

*Primary Examiner* — Dzung Tran
(74) *Attorney, Agent, or Firm* — Lewis Roca Rothgerber Christie LLP

(57) ABSTRACT

A display device includes: a base substrate having a display region including a first region and a second region, and a non-display region; a first semiconductor layer including polysilicon at the second region; a first conductive layer on a first insulating layer, and including a bottom gate electrode at the first region and a second-first gate electrode at the second region; a second semiconductor layer including an oxide on a second insulating layer at the first region; a second conductive layer on a third insulating layer, and including a top gate electrode at the first region and a second-second gate electrode at the second region; and a third conductive layer on a fourth insulating layer, and including a first source electrode and a first drain electrode connected to the second semiconductor layer, and a second source electrode and a second drain electrode connected to the first semiconductor layer.

11 Claims, 23 Drawing Sheets

120 : 121, 123
140 : 141, 143
150 : 151, 153, 155, 157, 159

(51) Int. Cl.
*H01L 27/12* (2006.01)
*H01L 29/24* (2006.01)
*H01L 29/786* (2006.01)
*H01L 29/66* (2006.01)

(52) U.S. Cl.
CPC ...... *H01L 27/3272* (2013.01); *H01L 51/0097* (2013.01); *H01L 27/1225* (2013.01); *H01L 27/1251* (2013.01); *H01L 27/1255* (2013.01); *H01L 27/1259* (2013.01); *H01L 29/24* (2013.01); *H01L 29/66757* (2013.01); *H01L 29/66969* (2013.01); *H01L 29/7869* (2013.01); *H01L 29/78633* (2013.01); *H01L 29/78648* (2013.01); *H01L 29/78675* (2013.01); *H01L 2227/323* (2013.01); *H01L 2251/5338* (2013.01)

(58) Field of Classification Search
CPC ............ H01L 27/1251; H01L 27/1255; H01L 51/0097; H01L 27/1259; H01L 29/24; H01L 29/66757; H01L 29/66969; H01L 29/78633; H01L 29/78648; H01L 29/78675; H01L 29/7869
USPC .......................................................... 257/40
See application file for complete search history.

(56) References Cited

U.S. PATENT DOCUMENTS

| | | | |
|---|---|---|---|
| 2016/0066409 A1* | 3/2016 | Kwon | H01L 27/3276 174/254 |
| 2016/0172410 A1* | 6/2016 | Kurokawa | H01L 31/0272 257/42 |
| 2016/0240801 A1* | 8/2016 | Chang | H01L 51/0097 |
| 2017/0141169 A1* | 5/2017 | Sim | H01L 27/3265 |
| 2018/0076238 A1* | 3/2018 | Lim | H01L 27/1255 |
| 2019/0355799 A1* | 11/2019 | Jeong | H01L 27/3262 |

* cited by examiner

120 : 121, 123
140 : 141, 143
150 : 151, 153, 155, 157, 159

120 : 121, 123
140 : 141, 143
150 : 151, 153, 155, 157, 159

120 : 121, 123
140 : 141, 143
150 : 151, 153, 155, 157, 159

120 : 121, 123
140 : 141, 143
150 : 151, 153, 155, 157, 159

SEMICONDUCTOR DEVICE AND METHOD FOR FABRICATING THE SAME

CROSS-REFERENCE TO RELATED APPLICATION

This application claims priority to and the benefit of Korean Patent Application No. 10-2019-0082715 filed on Jul. 9, 2019 in the Korean Intellectual Property Office, the disclosure of which is incorporated herein by reference in its entirety.

BACKGROUND

1. Field

One or more exemplary embodiments of the present disclosure relate to a display device.

2. Description of the Related Art

Importance of display devices is increasing along with the development of multimedia. Accordingly, various kinds of display devices, such as liquid crystal displays (LCDs) and organic light-emitting diode (OLED) displays, are being used. Among these display devices, an OLED display displays images using organic light-emitting elements, which generate light through recombination of electrons and holes. The OLED display includes a plurality of transistors, which supply driving currents to the organic light-emitting elements.

The above information disclosed in this Background section is for enhancement of understanding of the background of the present disclosure, and therefore, it may contain information that does not constitute prior art.

SUMMARY

One or more exemplary embodiments of the present disclosure are directed to a display device in which the number of masks used in a manufacturing process is reduced.

One or more exemplary embodiments of the present disclosure are directed to a method of manufacturing a display device in which the number of masks used in a manufacturing process is reduced.

It should be noted that aspects and features of the present disclosure are not limited to the above-described aspects and features, and other aspects and features of the present disclosure will be apparent to those skilled in the art from the following description.

According to an exemplary embodiment of the present disclosure, a display device includes: a base substrate having a display region and a non-display region adjacent to the display region, the display region including a first region and a second region; a first semiconductor layer at the second region of the base substrate, the first semiconductor layer including polysilicon; a first insulating layer on the first semiconductor layer; a first conductive layer on the first insulating layer, the first conductive layer including a bottom gate electrode at the first region and a second-first gate electrode at the second region; a second insulating layer on the first conductive layer; a second semiconductor layer on the second insulating layer at the first region, the second semiconductor layer including an oxide; a third insulating layer on the second semiconductor layer; a second conductive layer on the third insulating layer, the second conductive layer including a top gate electrode at the first region and a second-second gate electrode at the second region; a fourth insulating layer on the second conductive layer; and a third conductive layer on the fourth insulating layer, the third conductive layer including a first source electrode, a first drain electrode, a second source electrode, and a second drain electrode, each of the first source electrode and the first drain electrode being connected to the second semiconductor layer, and each of the second source electrode and the second drain electrode being connected to the first semiconductor layer.

In an exemplary embodiment, the bottom gate electrode and the top gate electrode may be electrically connected to each other.

In an exemplary embodiment, the display device may further include: a first via layer on the third conductive layer; and a pixel electrode on the first via layer. The pixel electrode may be directly connected to the second source electrode or the second drain electrode.

In an exemplary embodiment, the non-display region may include a bending region at a side of the display region; the first to fourth insulating layers may be configured to expose an upper surface of the base substrate at the bending region; the bending region may include a bending via layer on the base substrate, and a connection electrode on the bending via layer; and the third conductive layer may further include the connection electrode.

In an exemplary embodiment, the display device may further include a cap conductive pattern at the second region between the second insulating layer and the third insulating layer, and the cap conductive pattern, the second-first gate electrode, and the second insulating layer that is between the cap conductive pattern and the second-first gate electrode may define a capacitor.

In an exemplary embodiment, the cap conductive pattern may include the same material as that of the second semiconductor layer.

In an exemplary embodiment, the display device may further include a cap conductive pattern at the second region between the second insulating layer and the third insulating layer, and the second-second gate electrode and the cap conductive pattern may define a capacitor.

In an exemplary embodiment, the bottom gate electrode and the second-first gate electrode may include the same material.

In an exemplary embodiment, the top gate electrode and the second-second gate electrode may include the same material.

In an exemplary embodiment, the oxide of the second semiconductor layer may include at least one oxide selected from among gallium indium zinc oxide (G-I—Z—O), zinc (Zn), indium (In), gallium (Ga), tin (Sn), cadmium (Cd), germanium (Ge), hafnium (Hf), and a combination thereof.

In an exemplary embodiment, the first semiconductor layer, the second-first gate electrode, the second source electrode, and the second drain electrode may define a driving transistor, and the second semiconductor layer, the bottom gate electrode, the top gate electrode, the first source electrode, and the first drain electrode may define a switching transistor.

According to an exemplary embodiment of the present disclosure, a display device includes: a base substrate having a display region and a non-display region adjacent to the display region, the display region including a first region and a second region; a first semiconductor layer at the second region of the base substrate, the first semiconductor layer including polysilicon; a first insulating layer on the first semiconductor layer; a first conductive layer on the first insulating layer, the first conductive layer including a bottom gate electrode at the first region and a second-first gate electrode at the second region; a second insulating layer on the first conductive layer; a second semiconductor layer on the second insulating layer at the first region, the second semiconductor layer including an oxide; a third insulating layer on the second semiconductor layer; a second conductive layer on the third insulating layer, the second conductive layer including a top gate electrode at the first region; a fourth insulating layer on the second conductive layer; a third conductive layer on the fourth insulating layer, the third conductive layer including a first source electrode, a first drain electrode, a second source electrode, and a second drain electrode, each of the first source electrode and the first drain electrode being connected to the second semiconductor layer, and each of the second source electrode and the second drain electrode being connected to the first semiconductor layer; and a cap conductive pattern at the second region between the second insulating layer and the third insulating layer. The cap conductive pattern, the second-first gate electrode, and the second insulating layer that is between the cap conductive pattern and the second-first gate electrode define a capacitor.

In an exemplary embodiment, the cap conductive pattern may include the same material as that of the second semiconductor layer.

In an exemplary embodiment, a second-second gate electrode and the cap conductive pattern may define another capacitor.

According to an exemplary embodiment of the present disclosure, a method of manufacturing a display device, includes: providing a base substrate having a display region and a non-display region adjacent to the display region, the display region including a first region and a second region; forming a first semiconductor layer at the second region, the first semiconductor layer including polysilicon; forming a first insulating layer on the first semiconductor layer; forming a bottom gate electrode on the first insulating layer at the first region, and a second-first gate electrode on the first insulating layer at the second region, the bottom gate electrode and the second-first gate electrode being formed concurrently; forming a second insulating layer on the bottom gate electrode and the second-first gate electrode; forming a second semiconductor layer on the second insulating layer at the first region, the second semiconductor layer including an oxide; forming a third insulating layer on the second semiconductor layer; forming a top gate electrode on the third insulating layer at the first region, and a second-second gate electrode on the third insulating layer at the second region; forming a fourth insulating layer on the top gate electrode and the second-second gate electrode; and forming a first source electrode, a first drain electrode, a second source electrode, and a second drain electrode on the fourth insulating layer, each of the first source electrode and the first drain electrode being connected to the second semiconductor layer through a first contact hole, and each of the second source electrode and the second drain electrode being connected to the first semiconductor layer through a second contact hole.

In an exemplary embodiment, the method may further include: forming a first via layer on the first source electrode, the first drain electrode, the second source electrode, and the second drain electrode; and forming a pixel electrode on the first via layer, and the pixel electrode may be directly connected to the second source electrode or the second drain electrode.

In an exemplary embodiment, the non-display region may include a bending region at a side of the display region, and the method may further include: forming the first contact hole and the second contact hole between the forming of the fourth insulating layer and the forming of the first source electrode, the first drain electrode, the second source electrode, and the second drain electrode; and forming a third contact hole to extend through each of the first to fourth insulating layers at the bending region.

In an exemplary embodiment, the first contact hole, the second contact hole, and the third contact hole may be concurrently formed.

In an exemplary embodiment, the forming of the second semiconductor layer on the second insulating layer at the first region may include forming a cap conductive pattern on the second insulating layer at the second region, and the cap conductive pattern and the second semiconductor layer may be concurrently formed.

In an exemplary embodiment, the cap conductive pattern, the second-first gate electrode, and the second insulating layer that is between the cap conductive pattern and the second-first gate electrode may define a capacitor.

BRIEF DESCRIPTION OF THE DRAWINGS

The above and other aspects and features of the present disclosure will be more clearly understood from the detailed description of the illustrative, non-limiting exemplary embodiments with reference to the accompanying drawings, in which.

DETAILED DESCRIPTION

Figure 1:
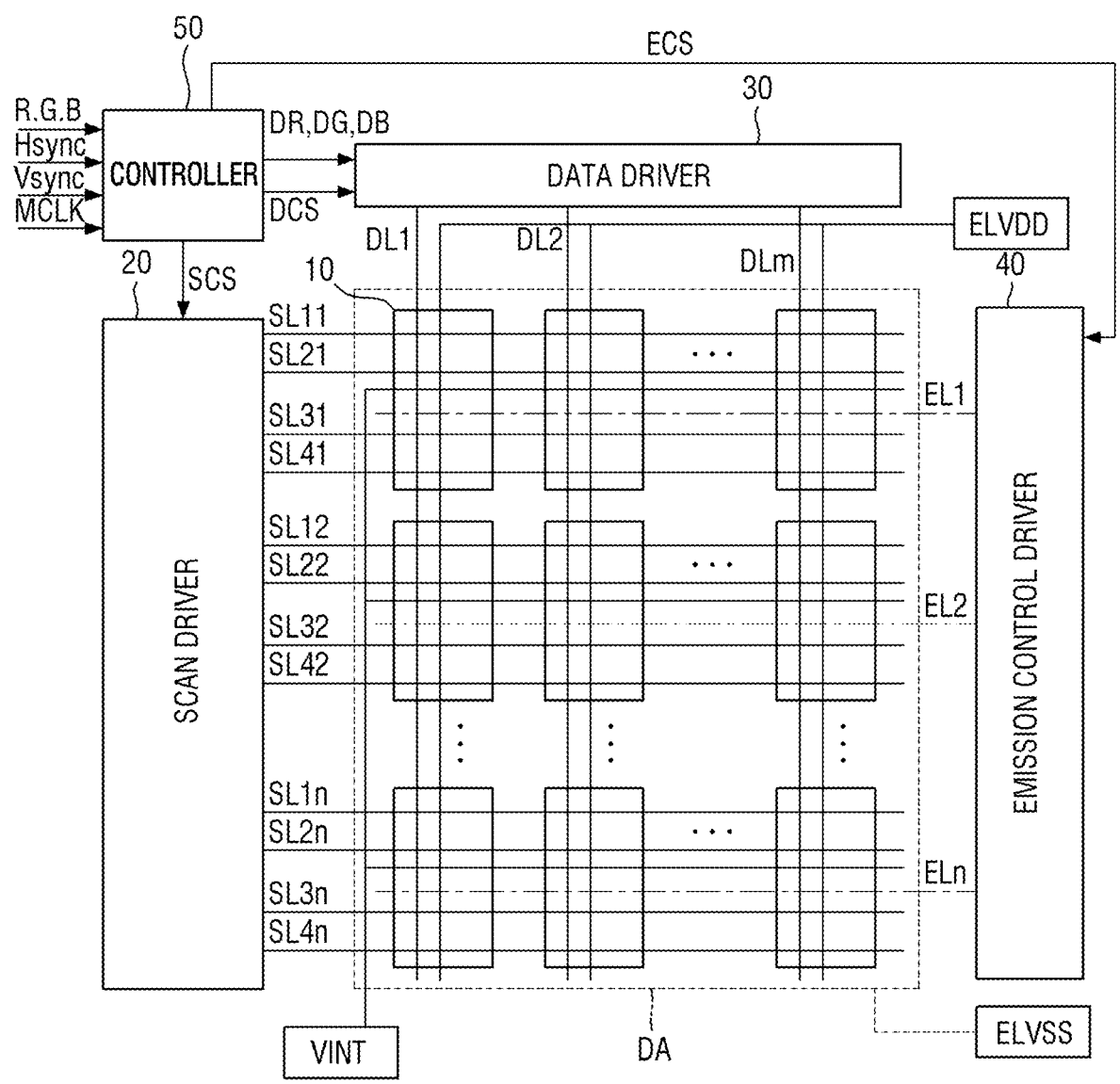
FIG. 1 is a schematic block diagram illustrating a display device according to an exemplary embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, an organic light-emitting display device will be described as an example of a display device, but the present disclosure is not limited to organic light-emitting display devices.

FIG. 1 is a schematic block diagram illustrating a display device according to an exemplary embodiment.

Referring to FIG. 1, a display device 1 includes a plurality of pixels 10 at a display region DA, a scan driver 20, a data driver 30 (e.g., see "900" of FIG. 3), an emission control driver 40, and a controller 50. The controller 50 may control the scan driver 20, the data driver 30, and the emission control driver 40. The controller 50 may be disposed on a main circuit board (e.g., see "500" of FIG. 3).

The display region DA of the display device 1 includes the plurality of pixels 10, which are disposed at crossing areas (e.g., intersections) between a plurality of scan lines SL11 to SL1n, SL21 to SL2n, SL31 to SL3n, and SL41 to SL4n (where n is an integer greater than or equal to two), a plurality of data lines DL1 to DLm (where m is an integer greater than or equal to two), and a plurality of emission control lines EL1 to ELn, which are arranged in the form of a matrix.

Each of the plurality of scan lines SL11 to SL1n, SL21 to SL2n, SL31 to SL3n, and SL41 to SL4n and the plurality of emission control lines EL1 to ELn may extend in a first direction (e.g., a row direction). Each of the plurality of data lines DL1 to DLm may extend in a second direction (e.g., a column direction) that crosses the first direction. For convenience, the first direction will be referred to hereinafter as a row direction, and the second direction will be referred to hereinafter as a column direction, but the present disclosure is not limited thereto, and in other embodiments, the first direction may be the column direction and the second direction may be the row direction. Accordingly, the row direction and the column direction may be switched with respect to each other.

A supply line of an initialization voltage VINT may be branched along the rows to extend in the row direction, and a supply line of a first power voltage ELVDD may be branched along the columns to extend in the column direction. In other words, the supply line of the initialization voltage VINT may include a plurality of branch portions that extend in the row direction, and the supply line of a first power voltage ELVDD may include a plurality of branch portions that extend in the column direction. However, the present disclosure is not limited thereto, and the extending directions of the supply line of the initialization voltage VINT (e.g., the branch portions thereof) and the supply line of the first power voltage ELVDD (e.g., the branch portions thereof) may be variously modified.

Four scan lines SL11, SL21, SL31, and SL41, one data line DL1, one emission control line EL1, one supply line of the initialization voltage VINT, and one supply line of the first power voltage ELVDD may extend (e.g., pass) through an exemplary pixel 10 (e.g., a pixel at (e.g., in or on) a first row and a first column). Similarly, each of the other pixels 10 may have four corresponding scan lines, one corresponding data line, one corresponding emission control line, one corresponding supply line of the initialization voltage VINT, and one corresponding supply line of the first power voltage ELVDD that extend (e.g., pass) therethrough.

The scan driver 20 generates and transmits four scan signals to the pixels 10 through the plurality of scan lines SL11 to SL1n, SL21 to SL2n, SL31 to SL3n, and SL41 to SL4n. The plurality of scan lines may include first scan lines SL11 to SL1n, second scan lines SL21 to SL2n, third scan lines SL31 to SL3n, and fourth scan lines SL41 to SL4n. In other words, the scan driver 20 may supply (e.g., sequentially supply) corresponding scan signals through the first scan lines SL11 to SL1n, the second scan lines SL21 to SL2n, the third scan lines SL31 to SL3n, and/or the fourth scan lines SL41 to SL4n.

The data driver 30 transmits data signals to the pixels 10 through the plurality of data lines DL1 to DLm. For example, when second scan signals are supplied to the second scan lines SL21 to SL2n, the data signals are supplied to the pixels 10 selected by the second scan signals.

The emission control driver 40 generates and transmits emission control signals to the pixels 10 through the plurality of emission control lines EL1 to ELn. The emission control signal controls an emission time of the pixel 10. However, the present disclosure is not limited thereto, and in some embodiments, the scan driver 20 may generate and transmit the emission control signals to the pixels 10. In this case, the emission control driver 40 may be omitted, for example, when the scan driver 20 generates the emission control signals as well as the scan signals, or according to an internal structure of the pixel 10.

The controller 50 converts a plurality of image signals R, G, and B that are transmitted from the outside into a plurality of image data signals DR, DG, and DB. The controller 50 transmits the plurality of image data signals DR, DG, and DB to the data driver 30. The controller 50 receives a vertical synchronizing signal Vsync, a horizontal synchronizing signal Hsync, and a clock signal MCLK, generates control signals for controlling driving of the scan driver 20, the data driver 30, and the emission control driver 40, and transmits the generated control signals to the scan driver 20, the data driver 30, and the emission control driver 40. In other words, the controller 50 generates and transmits a scan driving control signal SCS for controlling the scan driver 20, a data driving control signal DCS for controlling the data driver 30, and an emission driving control signal ECS for controlling the emission control driver 40.

Each of the plurality of pixels 10 receives the first power voltage ELVDD and a second power voltage ELVSS. The first power voltage ELVDD may have a first voltage (e.g., a high level voltage or a certain high level voltage), and the second power voltage ELVSS may have a second voltage that is different from the first voltage (e.g., a voltage level that is lower than that of the first power voltage ELVDD).

Each of the plurality of pixels 10 emits light having a suitable luminance (e.g., a predetermined luminance or a certain luminance) due to a driving current supplied to a light-emitting element according to a data signal transmitted through corresponding ones (e.g., each) of the plurality of data lines DL1 to DLm.

The first power voltage ELVDD, the second power voltage ELVSS, the initialization voltage VINT, and the like may be supplied from an external voltage source (e.g., one or more external power sources).

Figure 2:
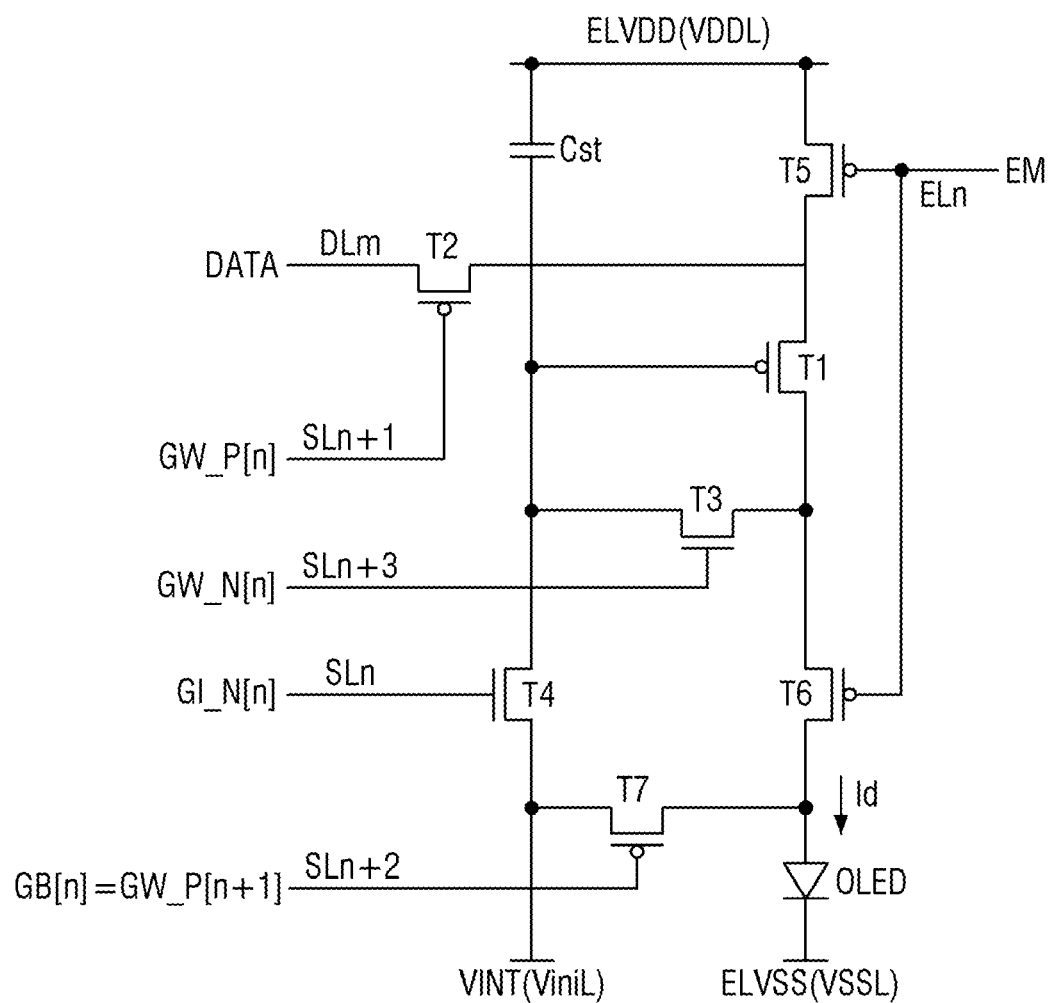
FIG. 2 is an equivalent circuit diagram illustrating one pixel of the display device according to an exemplary embodiment.

FIG. 2 is an equivalent circuit diagram illustrating one pixel of the display device according to an exemplary embodiment. For convenience, the pixel of FIG. 2 corresponds to a pixel 10 that is arranged at the nth row and the mth column of the display device 1 of FIG. 1, but the other pixels 10 may have the same or substantially the same structure and/or configuration as that of the pixel of FIG. 2, while connected to their corresponding signal lines.

Referring to FIG. 2, an exemplary circuit of one pixel from among the pixels 10 that is arranged at the nth row and the mth column of the display device 1 includes an organic light-emitting diode OLED, a plurality of transistors T1 to T7, and a storage capacitor Cst. A data signal DATA, a first scan signal GI_N(n), a second scan signal GW_P(n), a third scan signal GW_P(n+1), a fourth scan signal GW_N(n), an emission control signal EM, a first power voltage ELVDD, a second power voltage ELVSS, and an initialization voltage VINT are applied to the circuit of the pixel.

The organic light-emitting diode OLED includes an anode and a cathode. The storage capacitor Cst includes a first electrode and a second electrode.

The plurality of transistors may include first to seventh transistors T1 to T7. Each of the transistors T1 to T7 includes a gate electrode, a first electrode, and a second electrode. One of the first and second electrodes of each of the transistors T1 to T7 is a source electrode, and the other one of the first and second electrodes is a drain electrode.

Each of the transistors T1 to T7 may be a thin film transistor.

Each of the transistors T1 to T7 according to an exemplary embodiment includes a semiconductor layer. The semiconductor layers of the transistors T1 to T7 may include (or be made of) an oxide or a crystallized silicon. In some embodiments, the semiconductor layers of the transistors T1 to T7 may include different materials (e.g., depending on a type of the transistor). For example, the semiconductor layers of the first transistor T1, the second transistor T2, the fifth transistor T5, the sixth transistor T6, and the seventh transistor T7 may include (or be made of) a crystallized silicon, and the semiconductor layers of the third transistor T3 and the fourth transistor T4 may include (or be made of) an oxide.

The semiconductor layers of the first transistor T1, the second transistor T2, the fifth transistor T5, the sixth transistor T6, and the seventh transistor T7 that include (or that are made of) the crystallized silicon may be disposed at (e.g., in or on) the same or substantially the same layer, and the semiconductor layers of the third transistor T3 and the fourth transistor T4 that include (or that are made of) the oxide may be disposed at (e.g., in or on) the same or substantially the same layer. In addition, the semiconductor layers of the first transistor T1, the second transistor T2, the fifth transistor T5, the sixth transistor T6, and the seventh transistor T7 may be disposed on a different layer from that of the semiconductor layers of the third transistor T3 and the fourth transistor T4.

Hereinafter, each component will be described in more detail.

The gate electrode of the first transistor T1 is connected to the first electrode of the storage capacitor Cst. The first electrode of the first transistor T1 is connected to a first power voltage supply line VDDL for supplying the first power voltage ELVDD via the fifth transistor T5. The second electrode of the first transistor T1 is connected to the anode of the organic light-emitting diode OLED via the sixth transistor T6. The first transistor T1 receives the data signal DATA according to a switching operation of the second transistor T2, and supplies a driving current Id to the organic light-emitting diode OLED. In other words, the first transistor T1 may be a driving transistor.

The gate electrode of the second transistor T2 is connected to a second scan line SLn+1 (e.g., SL2n in FIG. 1) for supplying the second scan signal GW_P(n). The first electrode of the second transistor T2 is connected to a data line DLm. The second electrode of the second transistor T2 is connected to the first electrode of the first transistor T1, and is connected to the first power voltage supply line VDDL via the fifth transistor T5. The second transistor T2 is turned on in response to the second scan signal GW_P(n), and performs a switching operation to transmit the data signal DATA to the first electrode of the first transistor T1.

The gate electrode of the third transistor T3 is connected to a fourth scan line SLn+3 (e.g., SL4n in FIG. 1) for supplying the fourth scan signal GW_N(n), and the first electrode of the third transistor T3 is connected to both the first electrode of the sixth transistor T6 and the second electrode of the first transistor T1. The second electrode of the third transistor T3 is connected to each of the first electrode of the fourth transistor T4, the first electrode of the storage capacitor Cst, and the gate electrode of the first transistor T1.

The gate electrode of the fourth transistor T4 is connected to a first scan line SLn+3 (e.g., SL1n in FIG. 1) for supplying the first scan signal GI_N(n). The second electrode of the fourth transistor T4 is connected to both of a supply line ViniL of the initialization voltage VINT and the first electrode of the seventh transistor T7. The first electrode of the fourth transistor T4 is connected to each of the second electrode of the third transistor T3, the gate electrode of the first transistor T1, and the first electrode of the storage capacitor Cst.

The gate electrode of the fifth transistor T5 is connected to an emission control line ELn for supplying the emission control signal EM. The first electrode of the fifth transistor T5 is connected to the first power voltage supply line VDDL for supplying the first power voltage ELVDD. The second electrode of the fifth transistor T5 is connected to both of the first electrode of the first transistor T1 and the second electrode of the second transistor T2.

The gate electrode of the sixth transistor T6 is connected to the emission control line ELn for supplying the emission control signal EM. The first electrode of the sixth transistor T6 is connected to both the second electrode of the first transistor T1 and the first electrode of the third transistor T3. The second electrode of the sixth transistor T6 is connected to both the anode of the organic light-emitting diode OLED and the second electrode of the seventh transistor T7.

The fifth transistor T5 and the sixth transistor T6 are turned on (e.g., turned on concurrently) in response to the emission control signal EM, and thus, allow the driving current Id to flow in the organic light-emitting diode OLED.

The gate electrode of the seventh transistor T7 is connected to a third scan line SLn+2 (e.g., SL3n in FIG. 1) for supplying the third scan signal GW_P(n+1). The first electrode of the seventh transistor T7 is connected to both the second electrode of the fourth transistor T4 and the supply line ViniL of the initialization voltage VINT, and the second electrode of the seventh transistor T7 is connected to both the anode of the organic light-emitting diode OLED and the second electrode of the sixth transistor T6.

The second transistor T2 and the seventh transistor T7 may be switching transistors.

The second electrode of the storage capacitor Cst is connected to the first power voltage supply line VDDL. The first electrode of the storage capacitor Cst is connected to each of the gate electrode of the first transistor T1, the second electrode of the third transistor T3, and the first electrode of the fourth transistor T4. The cathode of the organic light-emitting diode OLED is connected to a supply line VSSL of the second power voltage ELVSS. The organic light-emitting diode OLED receives the driving current Id from the first transistor T1, and emits light to display an image.

Figure 3:
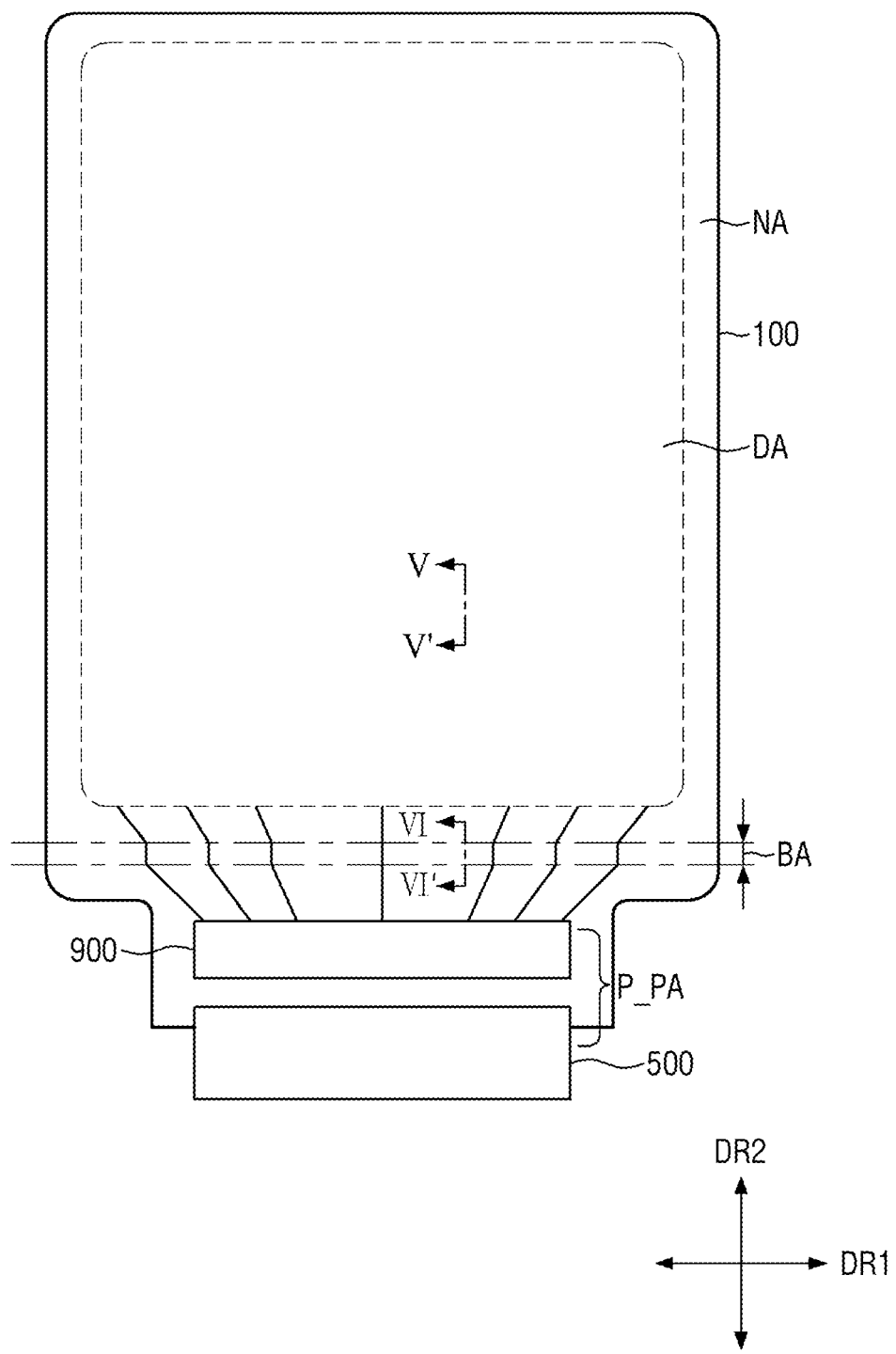
FIG. 3 is a plan layout view illustrating the display device according to an exemplary embodiment.
Figure 4:
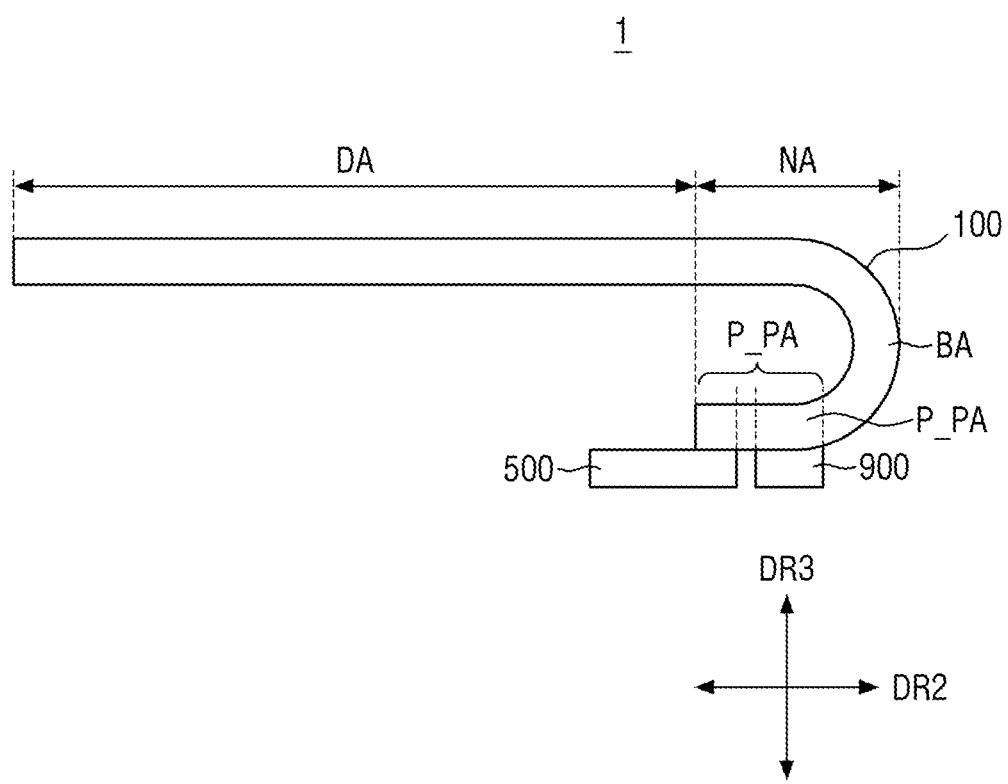
FIG. 4 is a schematic cross-sectional view illustrating the display device in FIG. 3 in a bent state according to an exemplary embodiment.
Figure 5:
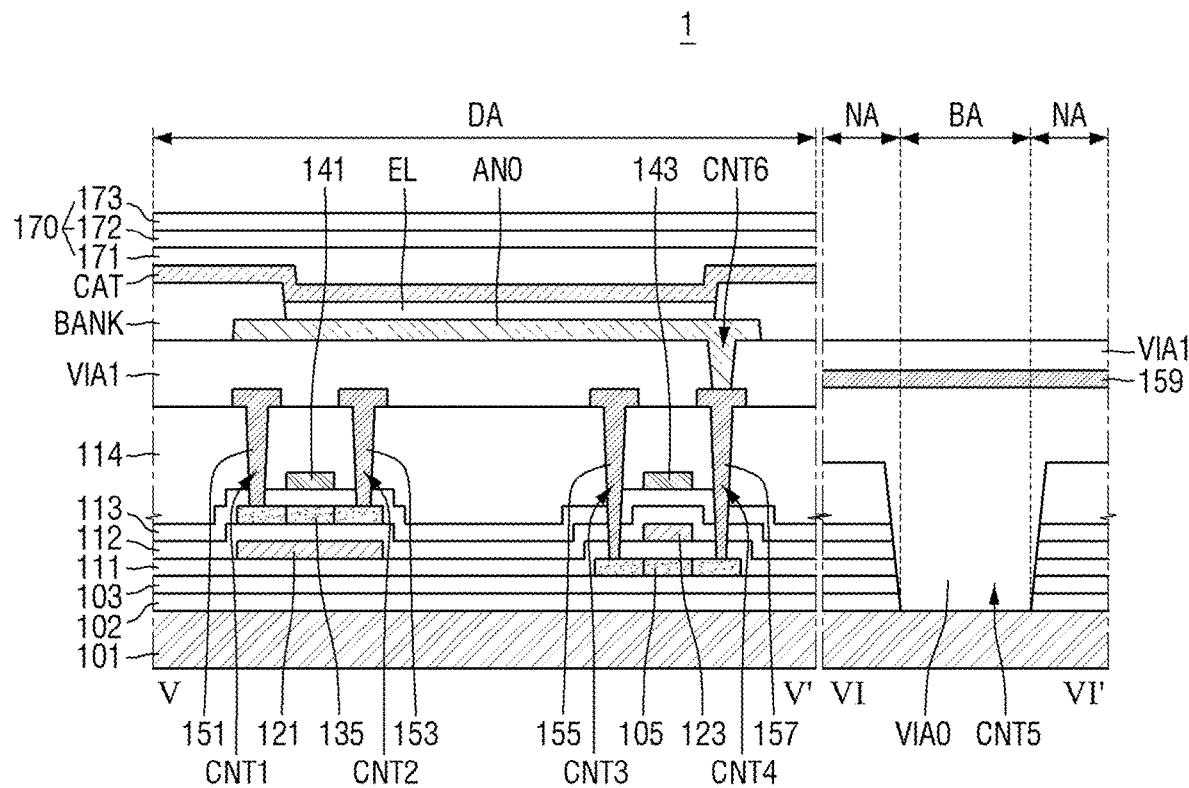
FIG. 5 shows cross-sectional views taken along the lines V-V' and VI-VI' of FIG. 3.

FIG. 3 is a plan layout view illustrating the display device according to an exemplary embodiment. FIG. 4 is a schematic cross-sectional view illustrating the display device in FIG. 3. in a bent state according to an exemplary embodiment. FIG. 5 shows cross-sectional views taken along the lines V-V' and VI-VI' of FIG. 3.

Referring to FIGS. 3 to 5, the display device 1 may include a display panel 100 configured to display an image, a driving integrated circuit 900 connected to (e.g., mounted on) the display panel 100, and a main circuit board 500 connected to the display panel 100.

In the present exemplary embodiment, the driving integrated circuit 900 may include a chip on plastic (COP). However, the present disclosure is not limited thereto, and in another embodiment, the driving integrated circuit 900 may include a chip on glass (COG).

The display panel 100 may be an organic light-emitting display panel. A case in which the display panel 100 is the organic light-emitting display panel will be exemplarily described in the following exemplary embodiments. However, the present disclosure is not limited thereto, and examples of the display panel 100 may include other types of display panels, for example, such as a liquid crystal display (LCD) panel, a quantum dot organic light-emitting diode (QD-OLED) display panel, a quantum dot LCD (QD-LCD) panel, a quantum nano light-emitting display (Nano LED) panel, a micro light-emitting display (LED) panel, and the like.

The display panel 100 includes a display region DA including a plurality of pixel regions, and a non-display region NA disposed around (e.g., to surround a periphery of) the display region DA. The display region DA may have a rectangular shape having corners that have a right angle in a plan view, or a rectangular shape having corners that are rounded in a plan view. The display region DA may have a short side and a long side. The short side of the display region DA may be a side that extends in a first direction DR1. The long side of the display region DA may be a side that extends in a second direction DR2. A shape (e.g., a planar shape or a shape in a plan view) of the display region DA is not limited to the rectangular shape shown in FIG. 3, and the display region DA may have any suitable shape, for example, such as a circular shape, an elliptical shape, or other various suitable shapes. The non-display region NA may be disposed adjacent to two short sides and two long sides of the display region DA. In this case, the non-display region NA may surround all sides (e.g., around a periphery) of the display region DA, and may form an edge (or a bezel) of the display region DA. However, the present disclosure is not limited thereto, and the non-display region NA may be disposed adjacent to only the two short sides, or adjacent to only the two long sides of the display region DA.

The non-display region NA of the display panel 100 further includes panel pad regions P_PA. The panel pad regions P_PA may be disposed, for example, around (e.g., adjacent to) one short side of the display region DA. However, the present disclosure is not limited thereto, and the panel pad regions P_PA may be disposed around (e.g., adjacent to) the two short sides of the display region DA, or may be disposed around (e.g., adjacent to) the two short sides and/or the two long sides.

The above-described driving integrated circuit 900 may be disposed at (e.g., in or on) the panel pad region P_PA. For example, the driving integrated circuit 900 may be disposed directly on the panel pad region P_PA of the display panel 100.

The main circuit board 500 may be connected to the panel pad region P_PA of the display panel 100. The main circuit board 500 may be disposed at a lower level in the second direction DR2 of the panel pad region P_PA when compared with the driving integrated circuit 900. The main circuit board 500 may be connected to (e.g., attached on) pads provided at (e.g., in or on) the panel pad region P_PA of the display panel 100 using an anisotropic conductive film. In some exemplary embodiments, the main circuit board 500 may be attached to a side (e.g., one side) of the display panel 100 through ultrasonic bonding. The above-described controller 50 (e.g., see FIG. 1) may be disposed on the main circuit board 500.

The driving integrated circuit 900 outputs signals and voltages for driving the display panel 100 based on signals generated by the controller 50 that is disposed on the main circuit board 500. The driving integrated circuit 900 may be formed as an integrated circuit, but the present disclosure is not limited thereto.

The non-display region NA of the display panel 100 may further include a bending (or a bent) region BA.

A base substrate 101 (e.g., see FIG. 5) of the display panel 100 may include (or be made of) an insulating material, for example, such as a polymer resin. Examples of a polymeric material may include polyethersulphone (PES), polyacrylate (PA), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), cellulose triacetate (CAT), cellulose acetate propionate (CAP), and/or suitable combinations thereof. The display panel 100 may include (or may be) a flexible substrate, which may be bendable, foldable, and/or rollable. An example of a material included in (e.g., constituting or forming) the flexible substrate may be PI, but the present disclosure is not limited thereto.

The bending region BA may be disposed between an array of the plurality of pixels and the panel pad region P_PA. The bending region BA may be disposed at (e.g., in or on) the non-display region NA. The display panel 100 may be folded (or bent) along a direction (e.g., in one direction) with respect to a bending line, which may be a reference line that is disposed at (e.g., in or on) the bending region BA. The bending line may be a straight line that is parallel to or substantially parallel to a lower side (or an upper side) of the display panel 100. As shown in FIG. 4, the bending region BA of the display panel 100 may be bent downward in a third direction DR3 that may cross each of the first and second directions DR1 and DR2. For example, the third direction DR3 may be perpendicular or substantially perpendicular to a plane defined by the first and second directions DR1 and DR2.

The panel pad regions P_PA of the display panel 100 may be disposed below the display region DA (e.g., along the second direction DR2 or underneath the display region DA in the third direction DR3) of the display panel 100. Therefore, each of the driving integrated circuit 900 and the main circuit board 500 that is attached to the panel pad regions P_PA of the display panel 100 may be disposed below the display region DA (e.g., along the second direction DR2 or underneath the display region DA in the third direction DR3) of the display panel 100, along with the panel pad regions P_PA of the bent display panel 100.

However, the present disclosure is not limited thereto, and in some embodiments, the display region DA and the panel pad regions P_PA may be connected to each other without the bending region BA. For example, in some embodiments, both the display region DA and the non-display region NA of the display panel 100 may be flat or substantially flat without including the bending region BA.

Referring to FIG. 5, the display panel 100 includes the base substrate 101, a plurality of conductive layers disposed on the base substrate 101, and a plurality of insulating layers disposed between the plurality of conductive layers. FIG. 5 shows exemplary cross-sectional views of structures of a pixel (e.g., one pixel) of the display region DA, and a structure of the non-display region NA of the display panel 100. Furthermore, FIG. 5 shows an exemplary cross-sectional view of a structure of the bending region BA of the non-display region NA.

In the exemplary embodiment of FIG. 5, the display panel 100 includes the base substrate 101, a buffer layer 102, a barrier layer 103, a first semiconductor layer 105, a first insulating layer 111, a first conductive layer 120, a second insulating layer 112, a second semiconductor layer 135, a third insulating layer 113, a second conductive layer 140, a fourth insulating layer 114, a bending via layer VIA0, a third conductive layer 150, a first via layer VIA1, a pixel electrode ANO, and a bank layer BANK, which may be sequentially disposed. Each of the above-described layers may be formed as a single layer (e.g., a single film) or may be formed as a multi-layered structure (e.g., a stacked film) including a plurality of layers or films. Other layers may be further disposed between corresponding layers of the above-described layers.

The base substrate 101 supports the respective layers disposed thereon. The display region DA, the non-display region NA, and the bending region BA of the non-display region NA may be defined on the base substrate 101. The display region DA includes a first region at (e.g., in or on) which a transistor including a semiconductor layer made of an oxide is disposed, and a second region which is disposed around (e.g., adjacent to) the first region and at (e.g., in or on) which a transistor including a semiconductor layer made of a crystallized silicon is disposed. For example, as described above, the third transistor T3 and the fourth transistor T4, which may include the semiconductor layer made of the oxide, may be disposed at (e.g., in or on) the first region. In this case, the first transistor T1, the second transistor T2, and the fifth transistor T5 to the seventh transistor T7, which may include the semiconductor layer made of the crystallized silicon, may be disposed at (e.g., in or on) the second region.

When the organic light-emitting display device is a bottom emission type or a double-sided emission type display device, a transparent substrate may be used as the base substrate 101. When the organic light-emitting display device is a top emission type display device, a semi-transparent substrate, an opaque substrate, and/or a transparent substrate may be used as the base substrate 101.

The structure material of the base substrate 101 may include any suitable one or suitable combinations of those described above, and thus, redundant descriptions thereof may not be repeated.

The buffer layer 102 may be disposed on the base substrate 101. The buffer layer 102 may prevent or substantially prevent diffusion of impurity ions, prevent or substantially prevent permeation of moisture and/or ambient air, and/or provide a planarized surface (e.g., perform a surface planarization function). The buffer layer 102 may include silicon nitride, silicon oxide, silicon oxynitride, and/or the like. However, the present disclosure is not limited thereto, and in some embodiments, the buffer layer 102 may be omitted according to (e.g., depending on or based on) the type of the substrate 101, process conditions, and/or the like.

The barrier layer 103 may be disposed on the buffer layer 102. The barrier layer 103 may include (or be made of) at least one selected from among silicon nitride, silicon oxide, and silicon oxynitride. However, the present disclosure is not limited thereto, and in some embodiments, the barrier layer 103 may be omitted according to (e.g., depending on or based on) the type of the substrate 101, process conditions, and/or the like.

The first semiconductor layer 105 may be disposed on the barrier layer 103. The first semiconductor layer 105 may be disposed at (e.g., in or on) the second region of the base substrate 101.

The first semiconductor layer 105 may include (or be made of) amorphous silicon, polysilicon, and/or the like. In this case, the polysilicon may be formed by crystallizing the amorphous silicon. A method of crystallizing the amorphous silicon may include various suitable methods such as, for example, rapid thermal annealing (RTA), solid phase crystallization (SPC), excimer laser annealing (ELA), metal induced crystallization (MIC), metal induced lateral crystallization (MILC), sequential lateral solidification (SLS), and the like.

The first semiconductor layer 105 may include a channel region disposed to overlap with a second-first gate electrode (or a second bottom gate electrode) 123 on (e.g., above) the channel region in a thickness direction thereof, and source/drain regions disposed at opposite sides (e.g., one side and the other side) of the channel region. The source/drain regions may include carrier ions as compared with the channel region, and thus, electrical resistance of the source/drain regions may be lower than electrical resistance of the channel region.

The first semiconductor layer 105 may be a semiconductor layer of any of the above-described first transistor T1, second transistor T2, fifth transistor T5, sixth transistor T6, and/or seventh transistor T7.

The first insulating layer 111 may be disposed on the first semiconductor layer 105. The first insulating layer 111 may be a gate insulating layer (e.g., a gate insulating film) having a gate insulating function. The first insulating layer 111 may include a silicon compound, a metal oxide, and/or the like. For example, the first insulating layer 111 may include silicon oxide, silicon nitride, silicon oxynitride, aluminum oxide, tantalum oxide, hafnium oxide, zirconium oxide, titanium oxide, and/or the like, which may be used alone or in any suitable combinations with each other. The first insulating layer 111 may be a single layer (e.g., a single film) or a multilayered structure (e.g., a multilayer film) including, for example, a stacked layer structure (e.g., a stacked film) of different materials.

The first conductive layer 120 is disposed on the first insulating layer 111. The first conductive layer 120 may include, for example, at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 120 may be a single layer (e.g., a single film) or a multilayered structure (e.g., a multilayer film).

The first conductive layer 120 may include a bottom gate electrode (e.g., a first bottom gate electrode or a first-first electrode) 121 disposed at (e.g., in or on) the first region, and the second-first gate electrode 123 that is disposed at (e.g., in or on) the second region. The bottom gate electrode 121 and the second-first gate electrode 123 may be formed concurrently (e.g., simultaneously or during the same or substantially the same process), and may be made of the same or substantially the same material.

The bottom gate electrode 121 may have a lower light shielding pattern. That is, the bottom gate electrode 121 may serve to prevent or substantially prevent light that is incident from a lower portion of the display panel 100 from entering the second semiconductor layer 135 disposed thereon.

The second insulating layer 112 is disposed on the first conductive layer 120. The second insulating layer 112 may be a gate insulating layer (e.g., a gate insulating film) having a gate insulating function. The second insulating layer 112 may include, for example, a silicon compound, a metal oxide, and/or the like. For example, the second insulating layer 112 may include silicon oxide, silicon nitride, silicon oxynitride, aluminum oxide, tantalum oxide, hafnium oxide, zirconium oxide, titanium oxide, and/or the like, which may be used alone or in any suitable combinations with each other. The second insulating layer 112 may be a single layer (e.g., a single film) or a multilayered structure (e.g., a multilayer film) including a stacked layer structure (e.g., a stacked film) of different materials.

The second semiconductor layer 135 is disposed on the second insulating layer 112. The second semiconductor layer 135 may be disposed at (e.g., in or on) the first region of the base substrate 101. The second semiconductor layer 135 may include (or be made of) an oxide. In other words, the second semiconductor layer 135 may be an oxide semiconductor layer. The oxide may include, for example, at least one oxide selected from among gallium indium zinc oxide (G-I—Z—O), zinc (Zn), indium (In), gallium (Ga), tin (Sn), cadmium (Cd), germanium (Ge), hafnium (Hf), or any suitable combinations thereof. For example, the oxide may include at least one selected from among indium gallium zinc oxide (IGZO), zinc tin oxide (ZTO), and indium tin oxide (ITO).

The second semiconductor layer 135 may include a channel region disposed to overlap with a gate electrode (e.g., a first top gate electrode or a first-second gate electrode) 141 on (e.g., above) the channel region in a thickness direction thereof, and source/drain regions disposed at opposite sides (e.g., one side and the other side) of the channel region. The source/drain regions may include carrier ions as compared with the channel region, and thus, electrical resistance of the source/drain regions may be lower than electrical resistance of the channel region. In other words, the source/drain regions, which may be doped with an impurity (e.g., and may have corresponding carrier ions) may have a lower electrical resistance than that of the channel region, which may not be doped.

The second semiconductor layer 135 may be a semiconductor layer of any of the above-described third transistor T3 and/or fourth transistor T4.

The third insulating layer 113 is disposed on the second semiconductor layer 135. The third insulating layer 113 may be a gate insulating layer (e.g., a gate insulating film) having a gate insulating function. The third insulating layer 113 may include, for example, a silicon compound, a metal oxide, and/or the like. For example, the third insulating layer 113 may include silicon oxide, silicon nitride, silicon oxynitride, aluminum oxide, tantalum oxide, hafnium oxide, zirconium oxide, titanium oxide, and/or the like, which may be used alone or in any suitable combinations with each other. The third insulating layer 113 may be a single layer (e.g., a single film) or a multilayered structure (e.g., a multilayer film) including a stacked layer structure (e.g., a stacked film) of different materials.

The second conductive layer 140 is disposed on the third insulating layer 113. The second conductive layer 140 may include, for example, at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second conductive layer 140 may be a single layer (e.g., a single film) or a multilayered structure (e.g., a multilayer film).

The second conductive layer 140 may include the top gate electrode 141 disposed at (e.g., in or on) the first region, and a second-second gate electrode (e.g., a second top gate electrode) 143 disposed at (e.g., in or on) the second region. The top gate electrode 141 and the second-second gate electrode 143 may be formed concurrently (e.g., simultaneously or during the same or substantially the same process), and may be made of the same or substantially the same material.

In the second semiconductor layer 135 of the third transistor T3 and the fourth transistor T4 that is disposed at (e.g., in or on) the first region of the base substrate 101, a channel may be turned on/off through the bottom gate electrode 121 and the top gate electrode 141 that are disposed below and on (e.g., or above) the second semiconductor layer 135, respectively. In other words, in some embodiments, each of the third transistor T3 and the fourth transistor T4 may be a double gate type transistor.

In some embodiments, the bottom gate electrode 121 and the top gate electrode 141 may be electrically connected to each other. In other words, the same scan signal may be applied (or supplied) to the bottom gate electrode 121 and the top gate electrode 141, and an on/off method of each of the third transistor T3 and the fourth transistor T4 may be controlled based on the same corresponding scan signal.

On the other hand, the second-first gate electrode 123 and the second-second gate electrode 143 that are disposed at (e.g., in or on) the second region may form a mutual capacitor. In other words, the second-first gate electrode 123 and the second-second gate electrode 143 may be the first electrode and the second electrode of the storage capacitor Cst.

The fourth insulating layer 114 is disposed on the second conductive layer 140. The fourth insulating layer 114 may be an interlayer insulating layer (e.g., an interlayer insulating film) having an interlayer insulating function. The fourth insulating layer 114 may include, for example, a silicon compound, a metal oxide, and/or the like. For example, the fourth insulating layer 114 may include silicon oxide, silicon nitride, silicon oxynitride, aluminum oxide, tantalum oxide, hafnium oxide, zirconium oxide, titanium oxide, and/or the like, which may be used alone or in any suitable combinations with each other. The fourth insulating layer 114 may be a single layer (e.g., a single film) or a multilayered structure (e.g., a multilayer film) including a stacked structure (e.g., a stacked film) of different materials.

A thickness of the fourth insulating layer 114 may be greater than a thickness of the first insulating layer 111 described above. The first to third insulating layers 111 to 113 may be formed to have the same or substantially the same thickness as each other on an entire surface, and may conformally reflect a lower stepped portion. Unlike the first to third insulating layers 111 to 113, the fourth insulating layer 114 may not conformally reflect a stepped portion of a lower structure. Accordingly, the fourth insulating layer 114 may provide a flat or substantially flat surface to enable the third conductive layer 150 to be disposed thereon to be flat or substantially flat.

On the other hand, the buffer layer 102, the barrier layer 103, and the first to fourth insulating layers 111 to 114 may not be disposed at (e.g., in or on) the bending region BA. Because the buffer layer 102, the barrier layer 103, and the first to fourth insulating layers 111 to 114 are not disposed at (e.g., in or on) the bending region BA, an upper surface of the base substrate 101 may be exposed at the bending region BA. For example, a fifth contact hole CNT5 (or a via hole) may further be formed to extend (e.g., pass) through the buffer layer 102, the barrier layer 103, and the first to fourth insulating layers 111 to 114 at (e.g., in or on) the bending region BA to expose the upper surface of the base substrate 101. Side surfaces of the buffer layer 102, the barrier layer 103, and the first to fourth insulating layers 111 to 114 may be exposed at (e.g., in or on) the bending region BA. The exposed side surfaces of the buffer layer 102, the barrier layer 103, and the first to fourth insulating layers 111 to 114 may be arranged in a stacked structure with each other, but the present disclosure is not limited thereto.

The fifth contact hole CNT5 (or the via hole) may be formed during a process of forming first to fourth contact holes CNT1 to CNT4, which will be described in more detail below. For example, the fifth contact hole CNT5 may be formed concurrently (e.g., simultaneously or during the same or substantially the same process) with the first to fourth contact holes CNT1 to CNT4.

Therefore, when the above-described display device 1 is bent at (e.g., in or on) the bending region, bending stress may be reduced or prevented.

The bending via layer VIA0 may be disposed at (e.g., in or on) the fifth contact hole CNT5 (or the via hole). The bending via layer VIA0 may be disposed on the fourth insulating layer 114 at (e.g., in or on) the non-display region NA, and may be disposed on the exposed side surfaces of the buffer layer 102, the barrier layer 103, and the first to fourth insulating layers 111 to 114 at (e.g., in or on) the bending region BA. The bending via layer VIA0 may be in contact (e.g., in direct contact) with the exposed upper surface of the base substrate 101.

The bending via layer VIA0 may include an inorganic insulating material or an organic insulating material, for example, such as a polyacrylate-based resin, an epoxy resin, a phenolic resin, a polyimide-based resin, a polyimide-based resin, an unsaturated polyester-based resin, a poly phenylenether-based resin, a polyphenylene sulfide-based resin, or benzocyclobutene (BCB). The bending via layer VIA0 may be a single layer (e.g., a single film) or a multilayered structure (e.g., a multilayer film) including a stacked structure (e.g., a stacked film) of different materials.

The third conductive layer 150 is disposed on the fourth insulating layer 114. The third conductive layer 150 may include, for example, at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer 150 may be a single layer (e.g., a single film) or a multilayered structure (e.g., a multilayer film).

The third conductive layer 150 may include first source/drain electrodes 151 and 153 that are disposed at (e.g., in or on) the first region, and second source/drain electrodes 155 and 157 that are disposed at (e.g., in or on) the second region.

The first source/drain electrodes 151 and 153 may be connected to the source/drain regions of the second semiconductor layer 135, and the second source/drain electrodes 155 and 157 may be connected to the source/drain regions of the first semiconductor layer 105.

The first source/drain electrodes 151 and 153 may be connected to the source/drain regions of the second semiconductor layer 135 through the first contact hole CNT1 and the second contact hole CNT2, respectively. Each of the first contact hole CNT1 and the second contact hole CNT2 may be disposed at (e.g., in or on) the first region, and may extend (e.g., pass) through the fourth insulating layer 114 and the third insulating layer 113.

The second source/drain electrodes 155 and 157 may be connected to the source/drain regions of the first semiconductor layer 105 through the third contact hole CNT3 and the fourth contact hole CNT4, respectively. Each of the third contact hole CNT3 and the fourth contact hole CNT4 may be disposed at (e.g., in or on) the second region, and may extend (e.g., pass) through the fourth insulating layer 114 through the first insulating layer 111 in a thickness direction thereof.

The third conductive layer 150 may further include a connection electrode 159 at (e.g., in or on) the non-display region NA and the bending region BA. The connection electrode 159 may be connected to the scan line, the data line, or the power voltage line of the above-described pixel, and may be connected to the panel pad region P_PA to define (e.g., form) pads of the display panel 100.

The connection electrode 159 may be formed in the same or substantially the same manner (e.g., method and/or process) as that of the first source/drain electrodes 151 and 153, and may be made of the same or substantially the same material as that of the first source/drain electrodes 151 and 153.

The first via layer VIA1 is disposed on the third conductive layer 150. The first via layer VIA1 may be disposed at (e.g., in or on) the display region DA and the non-display region NA.

The first via layer VIA1 may include an inorganic insulating material or an organic insulating material, for example, such as a polyacrylate-based resin, an epoxy resin, a phenolic resin, a polyamide-based resin, a polyimide-based resin, an unsaturated polyester-based resin, a poly phenylenether-based resin, a polyphenylene sulfide-based resin, or BCB. The first via layer VIA1 may be a single layer (e.g., a single film) or a multilayered structure (e.g., a multilayer film) including a stacked structure (e.g., a stacked film) of different materials The pixel electrode ANO is disposed on the first via layer VIA1. The pixel electrode ANO may be an anode. The pixel electrode ANO may be electrically connected to the second source electrode 155 or the second drain electrode 157 through a sixth contact hole CNT6 that extends (e.g., passes) through the first via layer VIA1. In some embodiments, the pixel electrode ANO may be connected (e.g., directly connected) to the second source electrode 155 or the second drain electrode 157 through the sixth contact hole CNT6 without being connected to a connection electrode (e.g., an intermediate connection electrode) or the like.

The pixel electrode ANO may be disposed separately for each pixel.

The bank layer BANK may be disposed on the pixel electrode ANO. The bank layer BANK may partially expose the pixel electrode ANO. The bank layer BANK may include (or be made of) an organic insulating material or an inorganic insulating material. For example, the bank layer BANK may include (or be made of) at least one selected from among a photoresist, a polyimide-based resin, an acrylic-based resin, a silicon compound, and a polyacrylic-based resin.

An organic layer EL may be disposed on an upper surface of the pixel electrode ANO and at (e.g., in or on) an opening of the bank layer BANK. A cathode CAT is disposed on the organic layer EL and the bank layer BANK. The cathode CAT may be a common electrode that is disposed on a plurality of pixels.

The pixel electrode ANO, the organic layer EL, and the cathode CAT may define (e.g., form or constitute) an organic light-emitting element (OLED).

A thin film encapsulation layer 170 is disposed on the cathode CAT. The thin film encapsulation layer 170 may cover the organic light-emitting element (OLED). The thin film encapsulation layer 170 may have a stacked structure (e.g., may be a stacked film) in which an inorganic layer (e.g., an inorganic film) and an organic layer (e.g., an organic film) are alternately stacked. For example, the thin film encapsulation layer 170 may include a first encapsulation inorganic layer (e.g., a first encapsulation inorganic film) 171, an encapsulation organic layer (e.g., an encapsulation organic film) 172, and a second encapsulation inorganic layer (e.g., a second encapsulation inorganic film) 173, which are stacked (e.g., sequentially stacked) on each other.

In the display device 1 according to one or more exemplary embodiments, the bottom gate electrode 121 of the first region and the second-first gate electrode 123 of the second region may be disposed at (e.g., on) the same or substantially the same layer. The bottom gate electrode 121 and the second-first gate electrode 123 may be formed concurrently (e.g., simultaneously or during the same or substantially the same process) using the same mask without using different masks, thereby reducing the number of masks.

In addition, the bottom gate electrode 121 of the first region and the second-first gate electrode 123 of the second region may be disposed at (e.g., on) the same or substantially the same layer, thereby reducing a thickness (e.g., an overall thickness) of the display device.

Furthermore, the top gate electrode 141 of the first region and the second-second gate electrode 143 of the second region may be disposed at (e.g., on) the same or substantially the same layer. The top gate electrode 141 of the first region and the second-second gate electrode 143 of the second region may be formed concurrently (e.g., simultaneously or during the same or substantially the same process) using the same mask without using different masks, thereby reducing the number of masks.

In addition, the top gate electrode 141 of the first region and the second-second gate electrode 143 of the second region may be disposed at (e.g., on) the same or substantially the same layer, thereby reducing a thickness (e.g., an overall thickness) of the display device.

Hereinafter, a method of manufacturing the display device according to an exemplary embodiment will be described. In the following exemplary embodiments, the same reference symbols are used to denote the same or substantially the same components as those of the one or more exemplary embodiments described above, and thus, redundant descriptions thereof may not be repeated or may be simplified.

Figure 6:
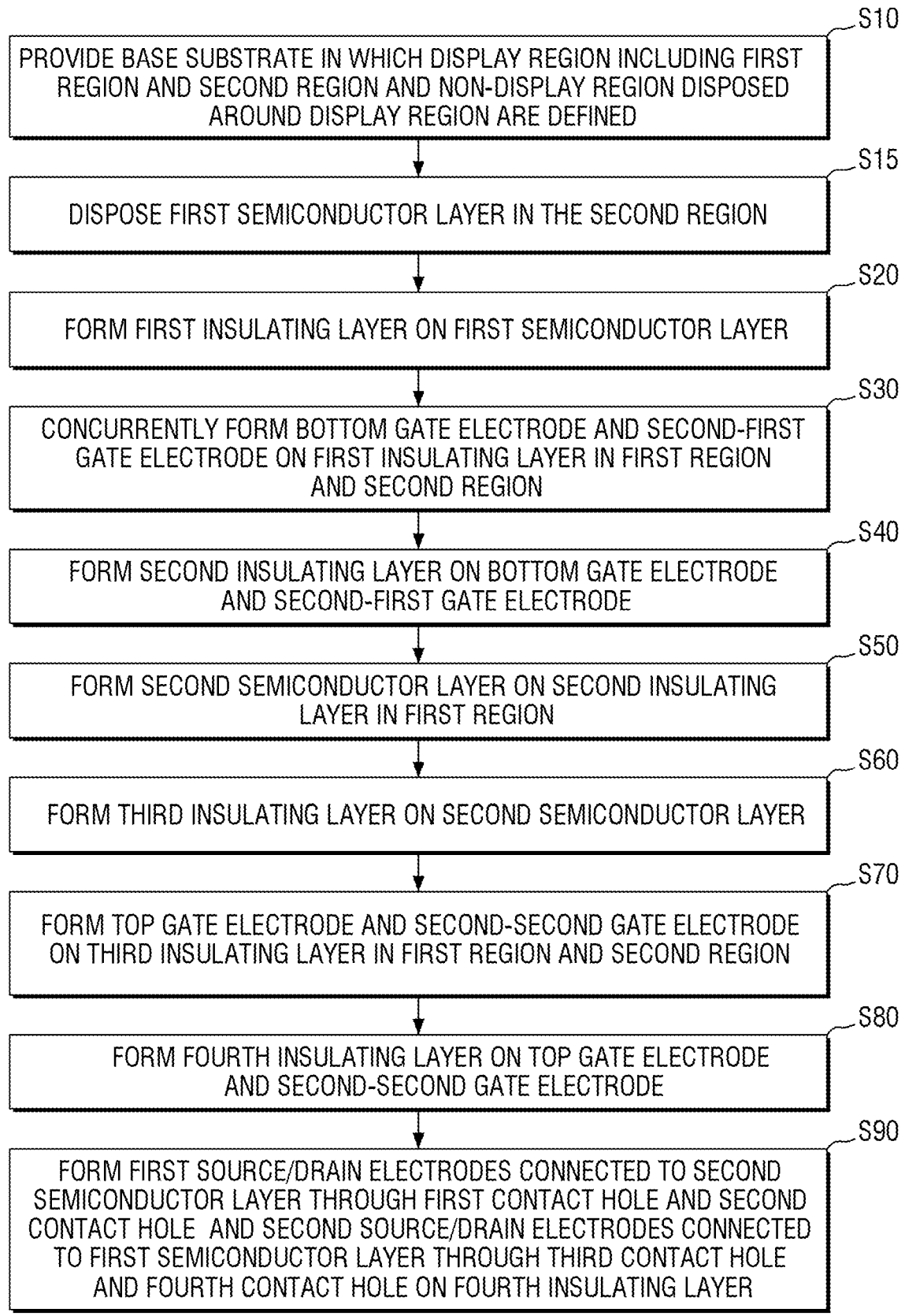
FIG. 6 is a flowchart illustrating a method of manufacturing the display device according to an exemplary embodiment.

FIG. 6 is a flowchart illustrating the method of manufacturing the display device according to an exemplary embodiment. FIGS. 7 to 21 are cross-sectional views illustrating a manufacturing process of the method of manufacturing the display device according to an exemplary embodiment.

Figure 7:
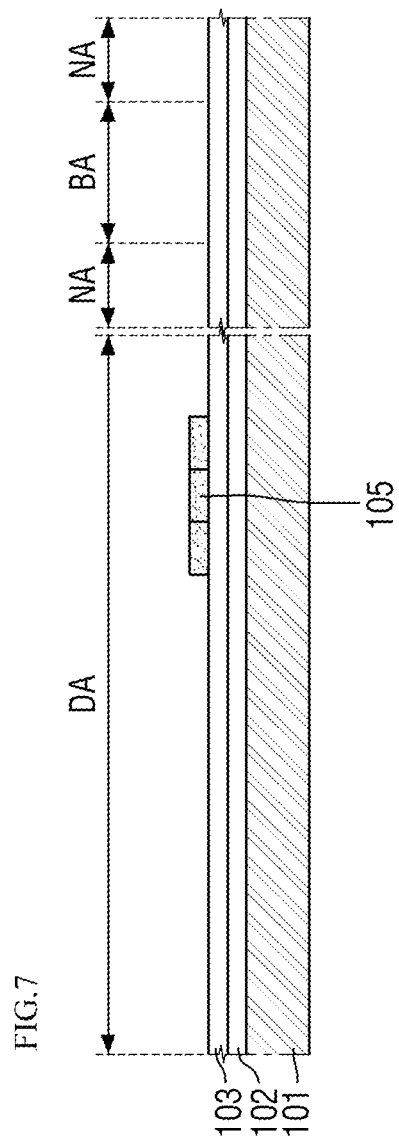
FIGS. 7-21 are cross-sectional views illustrating a manufacturing process of a method of manufacturing the display device according to an exemplary embodiment.

Referring to FIGS. 6 and 7 with reference to FIG. 5, the base substrate 101 is provided (S10). The base substrate 101 has the display region DA including the first region and the second region, and the non-display region NA disposed around (e.g., around a periphery of) the display region DA defined thereon. The first semiconductor layer 105 is disposed at (e.g., in or on) the second region (S15).

The structural material of the base substrate 101 has been described above, and thus, redundant descriptions thereof may not be repeated.

Operation S10 of providing the base substrate 101, after which the first semiconductor layer 105 is disposed at (e.g., in or on) the second region at operation S15, may further include stacking (e.g., sequentially stacking) the buffer layer 102 and the barrier layer 103 on the base substrate 101 prior to operation S15.

The buffer layer 102 may prevent or substantially prevent diffusion of impurity ions, prevent or substantially prevent permeation of moisture and/or ambient air, and/or provide a planarized surface (e.g., perform a surface planarization function). The buffer layer 102 may include, for example, silicon nitride, silicon oxide, silicon oxynitride, and/or the like. However, the present disclosure is not limited thereto, and the buffer layer 102 may be omitted according to (e.g., depending on or based on) the type of the substrate 101, process conditions, and/or the like.

The barrier layer 103 may include (or be made of) at least one selected from among silicon nitride, silicon oxide, and silicon oxynitride. However, the present disclosure is not limited thereto, and the barrier layer 103 may be omitted according to (e.g., depending on or based on) the type of the substrate 101, process conditions, and/or the like.

After the stacking (e.g., the sequentially stacking) of the buffer layer 102 and the barrier layer 103 on the base substrate 101, the first semiconductor layer 105 may be formed on the barrier layer 103 at operation S15. The first semiconductor layer 105 may be disposed at (e.g., in or on) the second region of the base substrate 101.

The first semiconductor layer 105 may include (or be made of) amorphous silicon, polysilicon, and/or the like. In this case, the polysilicon may be formed by crystallizing the amorphous silicon. A method of crystallizing the amorphous silicon may include various suitable methods, for example, such as RTA, SPC, ELA, MIC, MILC, SLS, and the like.

The first semiconductor layer 105 may include the channel region disposed to overlap with the second-first gate electrode 123 that is on (e.g., or above) the channel region in a thickness direction thereof, and the source/drain regions disposed at opposite sides (e.g., one side and the other side) of the channel region. The source/drain regions may include carrier ions as compared with the channel region, and thus, electrical resistance of the source/drain regions may be lower than electrical resistance of the channel region.

The first semiconductor layer 105 may be the semiconductor layer of any of the above-described first transistor T1, second transistor T2, fifth transistor T5, sixth transistor T6, and/or seventh transistor T7.

Figure 8:
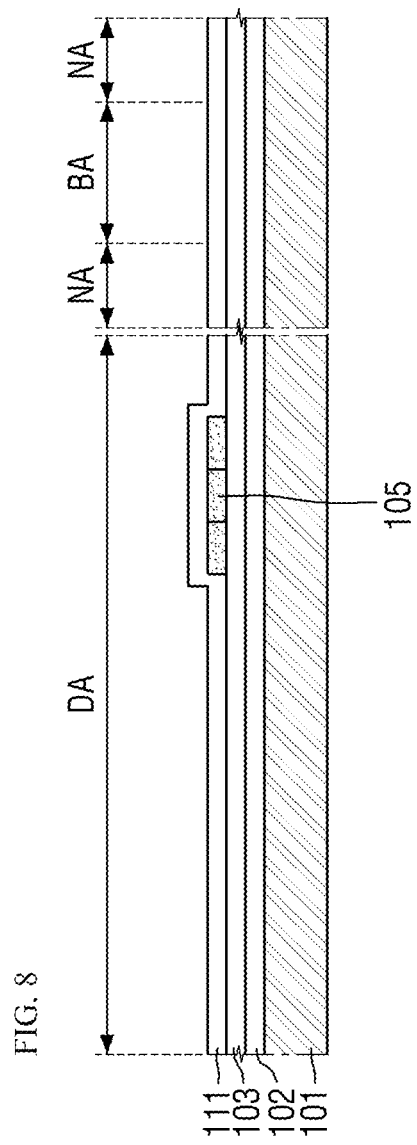

Referring to FIGS. 6 and 8 with reference to FIG. 5, the first insulating layer 111 is formed on the first semiconductor layer 105 (S20).

The first insulating layer 111 may be a gate insulating layer (e.g., a gate insulating film) having a gate insulating function. The first insulating layer 111 may include, for example, a silicon compound, a metal oxide, and/or the like. For example, the first insulating layer 111 may include silicon oxide, silicon nitride, silicon oxynitride, aluminum oxide, tantalum oxide, hafnium oxide, zirconium oxide, titanium oxide, and/or the like, which may be used alone or in any suitable combinations with each other. The first insulating layer 111 may be a single layer (e.g., a single film) or a multilayered structure (e.g., a multilayer film) including a stacked structure (e.g., a stacked film) of different materials.

Figure 9:
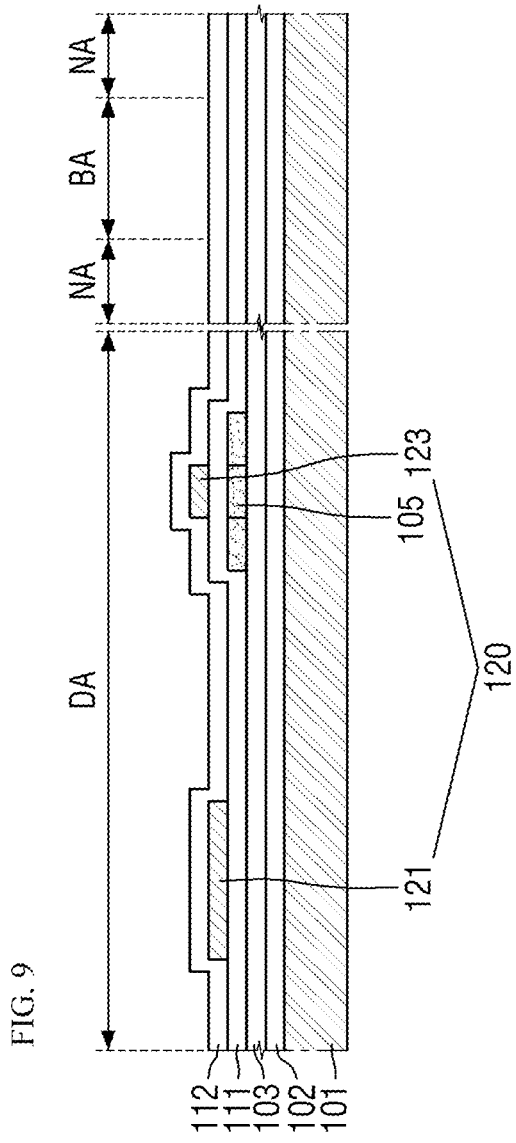

Referring to FIGS. 6 and 9 with reference to FIG. 5, the bottom gate electrode 121 is formed on the first insulating layer 111 at (e.g., in or on) the first region, and the second-first gate electrode 123 is formed on the first insulating layer 111 at (e.g., in or on) the second region (S30). The bottom gate electrode 121 and the second-first gate electrode 123 may be formed concurrently (e.g., simultaneously or during the same or substantially the same process).

The bottom gate electrode 121 and the second-first gate electrode 123 may be formed (e.g., concurrently formed) using the same mask, and may be made of the same or substantially the same material.

The bottom gate electrode 121 and the second-first gate electrode 123 may include, for example, at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). Each of the bottom gate electrode 121 and the second-first gate electrode 123 may be a single layer (e.g., a single film) or a multilayered structure (e.g., a multilayer film).

The bottom gate electrode 121 may include (or may be) a lower light shielding pattern. For example, the bottom gate electrode 121 may serve to prevent or substantially prevent light that is incident from the lower portion of the display panel 100 from entering the second semiconductor layer 135 that is disposed thereon.

Figure 10:
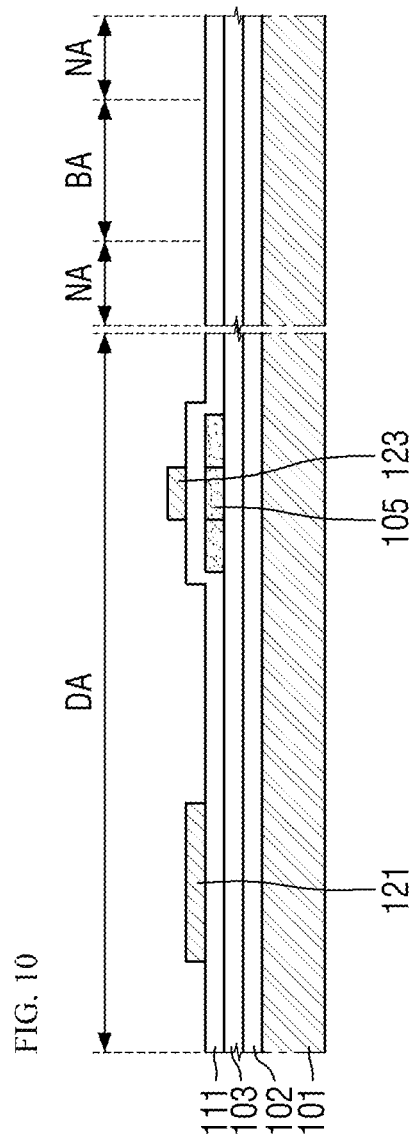

Referring to FIGS. 6 and 10 with reference to FIG. 5, the second insulating layer 112 is formed on the bottom gate electrode 121 and the second-first gate electrode 123 (S40).

The second insulating layer 112 may include (or may be) a gate insulating layer (e.g., a gate insulating film) having a gate insulating function. The second insulating layer 112 may include, for example, a silicon compound, a metal oxide, and/or the like. For example, the second insulating layer 112 may include silicon oxide, silicon nitride, silicon oxynitride, aluminum oxide, tantalum oxide, hafnium oxide, zirconium oxide, titanium oxide, and/or the like, which may be used alone or in any suitable combinations with each other. The second insulating layer 112 may be a single layer (e.g., a single film) or a multilayered structure (e.g., a multilayer film) including a stacked structure (e.g., a stacked film) of different materials.

Figure 11:
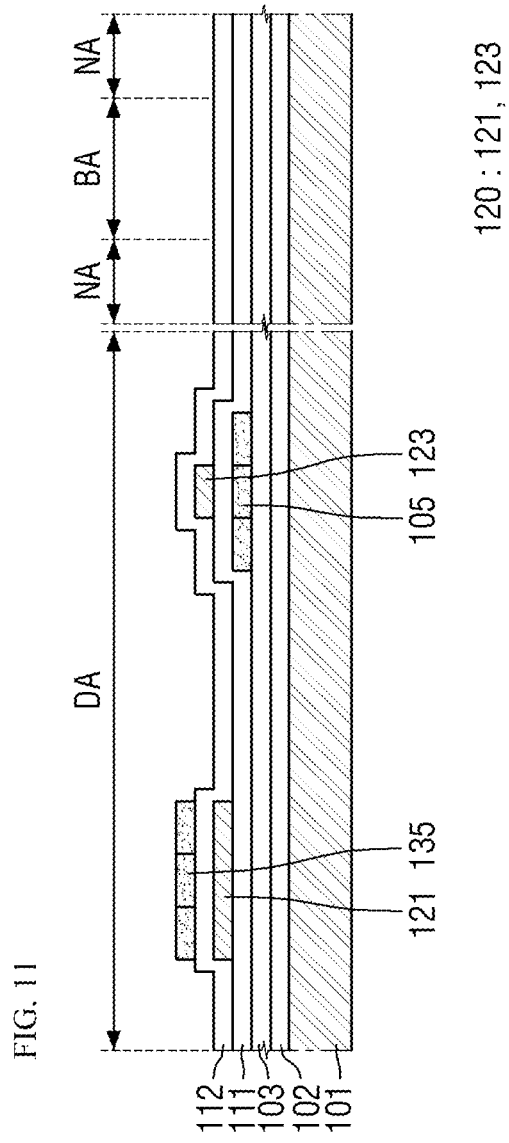

Referring to FIGS. 6 and 11 with reference to FIG. 5, the second semiconductor layer 135 is formed on the second insulating layer 112 at (e.g., in or on) the first region (S50).

The second semiconductor layer 135 may be disposed at (e.g., in or on) the first region of the base substrate 101. The second semiconductor layer 135 may include (or be made) of an oxide. In other words, the second semiconductor layer 135 may be an oxide semiconductor layer. The oxide may include, for example, at least one selected from among IGZO, ZTO, and ITO.

The second semiconductor layer 135 may include the channel region disposed to overlap with the top gate electrode 141 that is on (e.g., or above) the channel region in a thickness direction thereof, and the source/drain regions disposed at opposite sides (e.g., one side and the other side) of the channel region. The source/drain regions may include carrier ions as compared with the channel region, and thus, electrical resistance of the source/drain regions may be lower than electrical resistance of the channel region.

The second semiconductor layer 135 may be the semiconductor layer of any of the above-described third transistor T3 and/or fourth transistor T4.

Figure 12:
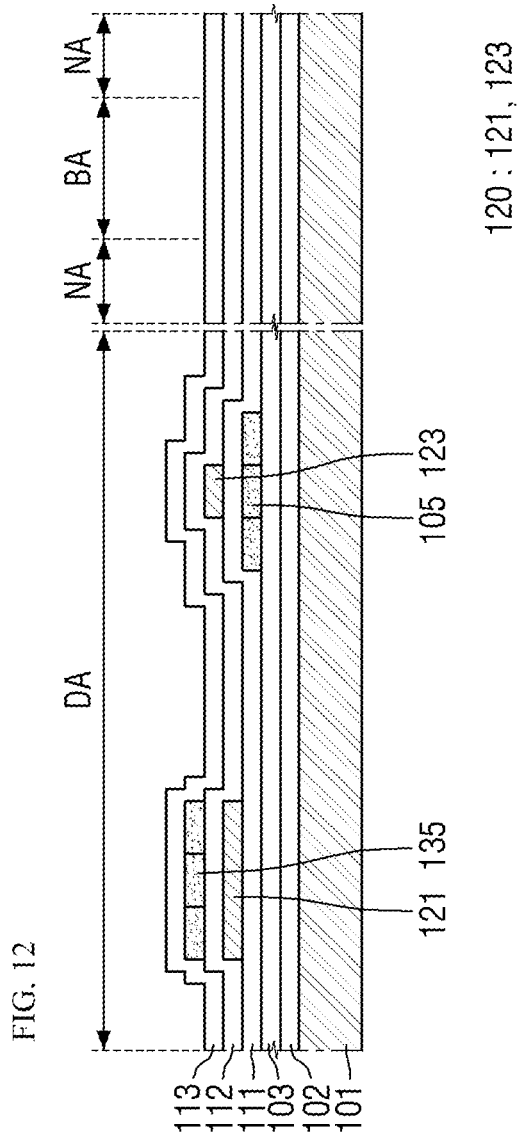

Referring to FIGS. 6 and 12 with reference to FIG. 5, the third insulating layer 113 is formed on the second semiconductor layer 135 (S60).

The third insulating layer 113 may include (or may be) a gate insulating layer (e.g., a gate insulating film) having a gate insulating function. The third insulating layer 113 may include, for example, a silicon compound, a metal oxide, and/or the like. For example, the third insulating layer 113 may include silicon oxide, silicon nitride, silicon oxynitride, aluminum oxide, tantalum oxide, hafnium oxide, zirconium oxide, titanium oxide, and/or the like, which may be used alone or in any suitable combinations with each other. The third insulating layer 113 may be a single layer (e.g., a single film) or a multilayered structure (e.g., a multilayer film) including a stacked structure (e.g., a stacked film) of different materials.

Figure 13:
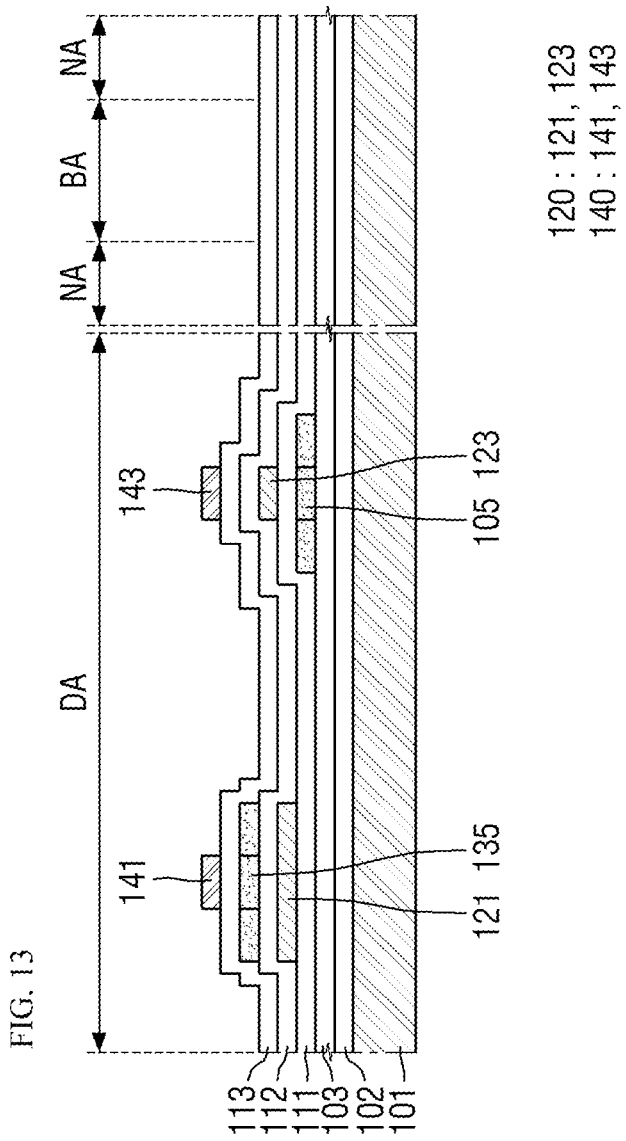

Referring to FIGS. 6 and 13 with reference to FIG. 5, the top gate electrode 141 is formed on the third insulating layer 113 at (e.g., in or on) the first region and the second-second gate electrode 143 is formed on the third insulating layer 113 at (e.g., in or on) the second region (S70).

The top gate electrode 141 and the second-second gate electrode 143 may be formed concurrently using the same mask, and may be made of the same or substantially the same material.

The top gate electrode 141 and the second-second gate electrode 143 may include, for example, at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). Each of the top gate electrode 141 and the second-second gate electrode 143 may be a single layer (e.g., a single film) or a multilayered structure (e.g., a multilayer film).

In the second semiconductor layer 135 of the third transistor T3 and/or the fourth transistor T4 that is disposed at (e.g., in or on) the first region of the base substrate 101, a channel may be turned on/off through the bottom gate electrode 121 and the top gate electrode 141 that are disposed below and above (e.g., or on) the second semiconductor layer 135, respectively. For example, each of the third transistor T3 and the fourth transistor T4 may be a double gate type transistor.

In some embodiments, the bottom gate electrode 121 and the top gate electrode 141 may be electrically connected to each other. For example, the same scan signal may be supplied (or applied) to the bottom gate electrode 121 and the top gate electrode 141, and an on/off method of the third transistor T3 and the fourth transistor T4 may be controlled based on the same scan signal.

On the other hand, the second-first gate electrode 123 and the second-second gate electrode 143 that are disposed at (e.g., in or on) the second region may form a mutual capacitor. For example, the second-first gate electrode 123 and the second-second gate electrode 143 may be the first electrode and the second electrode of the storage capacitor Cst.

Figure 14:
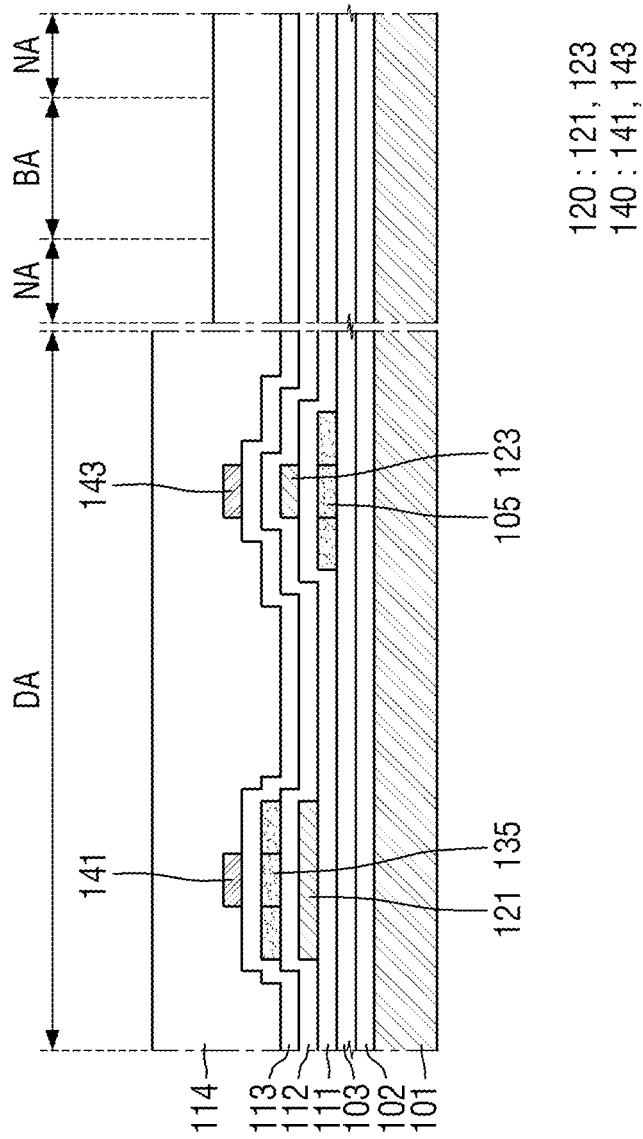

Referring to FIGS. 6 and 14 with reference to FIG. 5, the fourth insulating layer 114 is formed on the top gate electrode 141 and the second-second gate electrode 143 (S80).

The fourth insulating layer 114 may be an interlayer insulating layer (e.g., an interlayer insulating film) having an interlayer insulating function. The fourth insulating layer 114 may include, for example, a silicon compound, a metal oxide, and/or the like. For example, the fourth insulating layer 114 may include silicon oxide, silicon nitride, silicon oxynitride, aluminum oxide, tantalum oxide, hafnium oxide, zirconium oxide, titanium oxide, and/or the like, which may be used alone or in any suitable combinations with each other. The fourth insulating layer 114 may be a single layer (e.g., a single film) or a multilayered structure (e.g., a multilayer film) including a stacked structure (e.g., a stacked film) of different materials.

Figure 15:
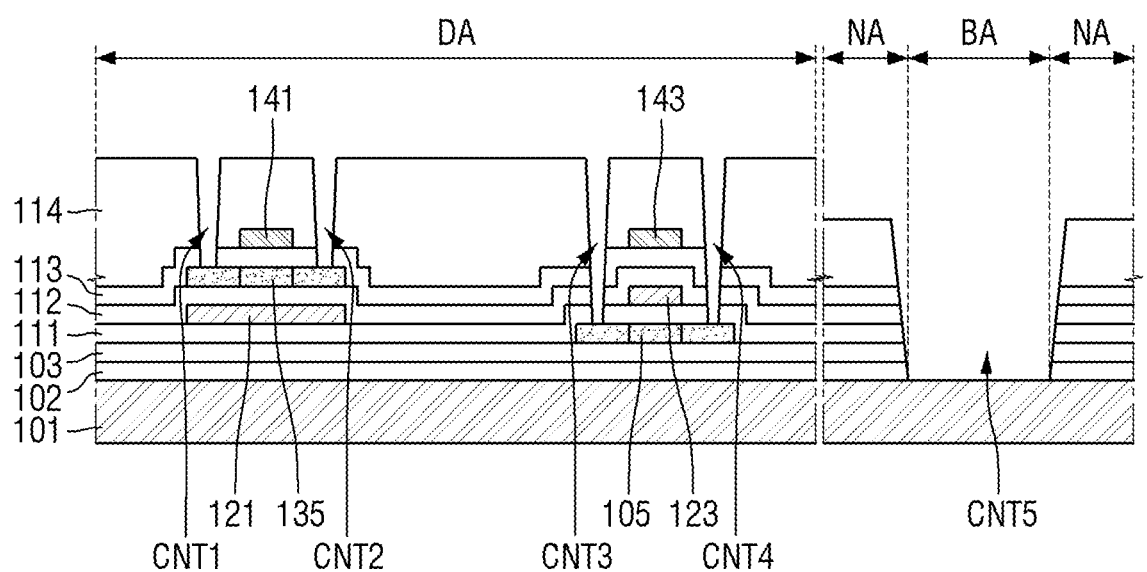

Referring to FIGS. 6 and 15 with reference to FIG. 5, the first to fifth contact holes CNT1 to CNT5 (or the via holes) described above with reference to FIG. 6 are formed. For example, the first to fifth contact holes CNT1 to CNT5 may be formed between operation S80 and operation S90, which will be described in more detail below.

Each of the first contact hole CNT1 and the second contact hole CNT2 may be disposed at (e.g., in or on) the first region, and may extend (e.g., pass) through the fourth insulating layer 114 and the third insulating layer 113.

An operation of forming the first to fourth contact holes CNT1 to CNT4 may be performed during the same or substantially the same process as an operation of forming the fifth contact hole CNT5 (or the via hole).

Each of the third contact hole CNT3 and the fourth contact hole CNT4 may be disposed at (e.g., in or on) the second region, and may extend (e.g., pass) through each of the fourth insulating layer 114 through the first insulating layer 111 in a thickness direction thereof.

The fifth contact hole CNT5 may be disposed at (e.g., in or on) the bending region BA, and may extend (e.g., sequentially pass) through each of the fourth insulating layer 114 through the buffer layer 102 in a thickness direction thereof. The fifth contact hole CNT5 may expose the upper surface of the base substrate 101.

Figure 16:
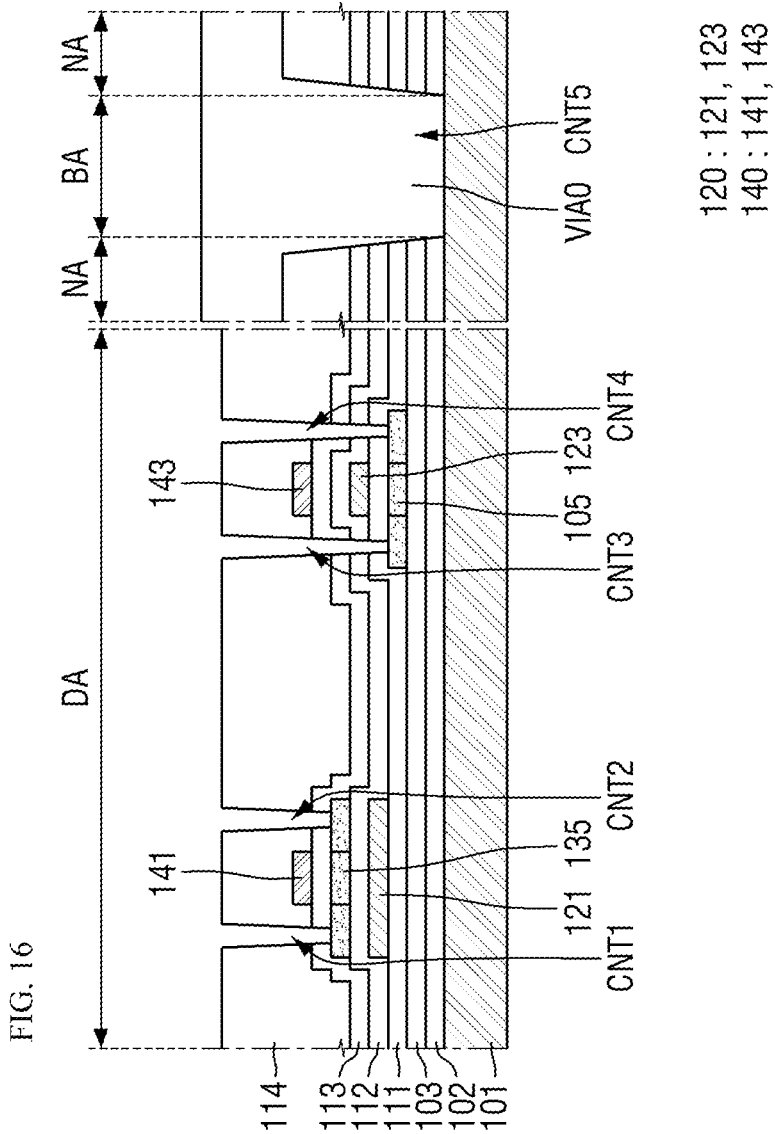

Referring to FIGS. 6 and 16 with reference to FIG. 5, the bending via layer VIA0 is formed in the fifth contact hole CNT5. For example, the bending via layer VIA0 may be formed between operation S80 and operation S90, after the forming of the first to fifth contact holes CNT1 to CNT5.

The bending via layer VIA0 may be disposed on the fourth insulating layer 114 at (e.g., in or on) the non-display region NA, and may be disposed on the exposed side surfaces of the buffer layer 102, the barrier layer 103, and the first to fourth insulating layers 111 to 114 at (e.g., in or on) the bending region BA. The bending via layer VIA0 may be formed to be in contact (e.g., in direct contact) with the exposed upper surface of the base substrate 101.

The bending via layer VIA0 may include an inorganic insulating material or an organic insulating material, for example, such as a polyacrylate-based resin, an epoxy resin, a phenolic resin, a polyimide-based resin, a polyimide-based resin, an unsaturated polyester-based resin, a poly phenylenether-based resin, a polyphenylene sulfide-based resin, or BCB. The bending via layer VIA0 may be a single layer (e.g., a single film) or a multilayered structure (e.g., a multilayer film) including a stacked structure (e.g., a stacked film) of different materials.

Figure 17:
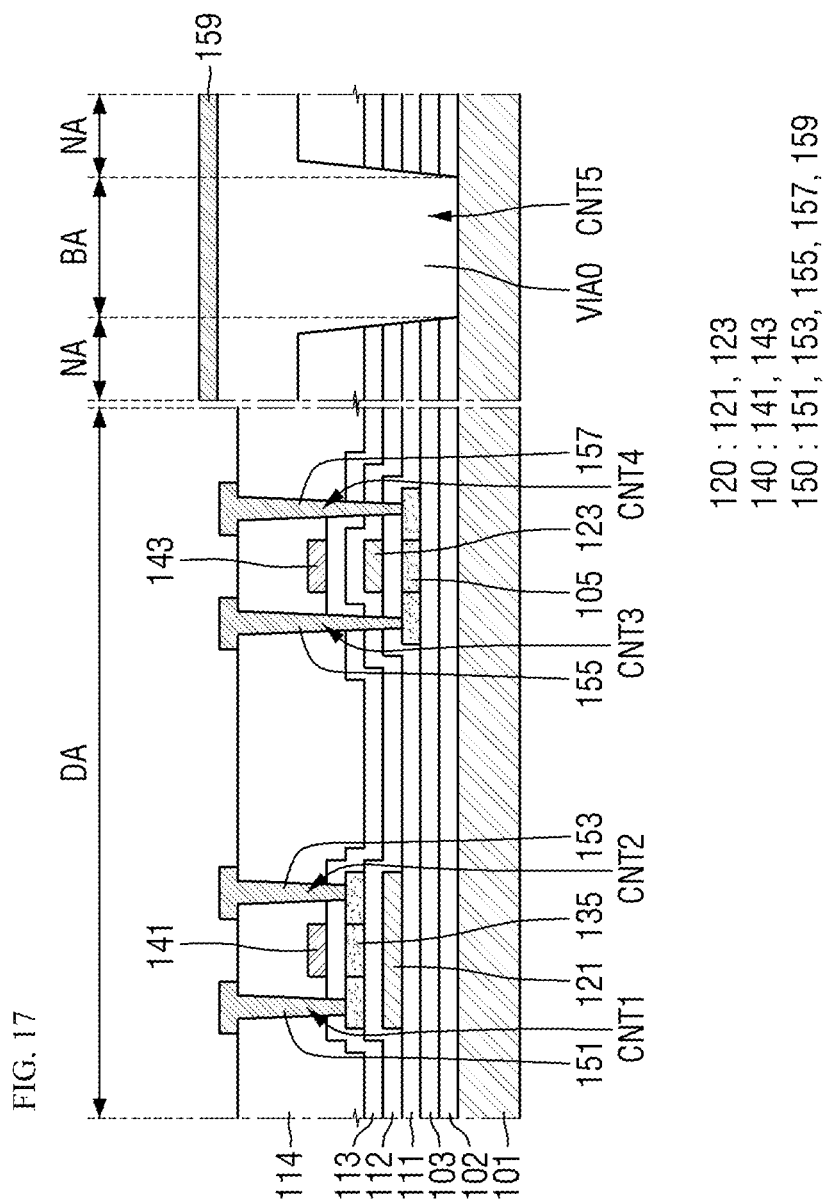

Referring to FIGS. 6 and 17 with reference to FIG. 5, the first source/drain electrodes 151 and 153 are connected to the second semiconductor layer 135 through the first contact hole CNT1 and the second contact hole CNT2, respectively, and the second source/drain electrodes 155 and 157 are connected to the first semiconductor layer 105 through the third contact hole CNT3 and the fourth contact hole CNT4, respectively, which are formed on the fourth insulating layer 114, and the connection electrode 159 is formed on the bending via layer VIA0 (S90).

The first source/drain electrodes 151 and 153, the second source/drain electrodes 155 and 157, and the connection electrode 159 may each include, for example, at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first source/drain electrodes 151 and 153, the second source/drain electrodes 155 and 157, and the connection electrode 159 may be formed (e.g., concurrently formed) of the same or substantially the same material using the same mask. The first source/drain electrodes 151 and 153, the second source/drain electrodes 155 and 157, and the connection electrode 159 may each be a single layer (e.g., a single film) or a multilayered structure (e.g., a multilayer film).

Figure 18:
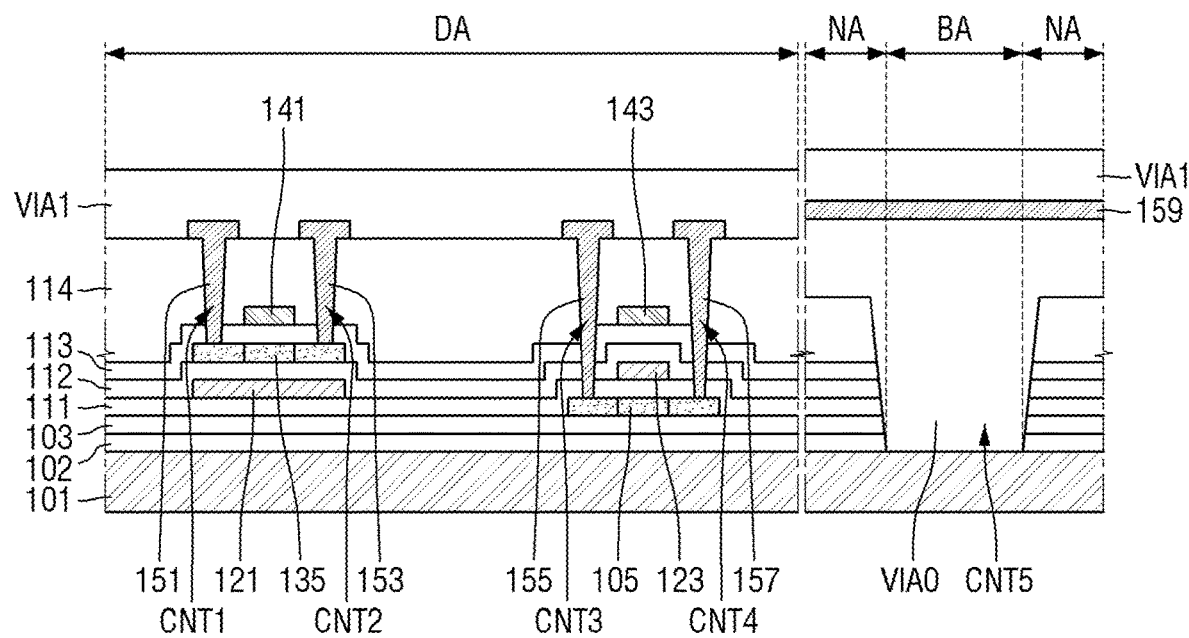

Referring to FIGS. 6 and 18 with reference to FIG. 5, the first via layer VIA1 is formed on the first source/drain electrodes 151 and 153, the second source/drain electrodes 155 and 157, and the connection electrode 159.

The first via layer VIA1 may be disposed at (e.g., in or on) the display region DA and the non-display region NA.

The first via layer VIA1 may include an inorganic insulating material or an organic insulating material, for example, such as a polyacrylate-based resin, an epoxy resin, a phenolic resin, a polyamide-based resin, a polyimide-based resin, an unsaturated polyester-based resin, a poly phenylenether-based resin, a polyphenylene sulfide-based resin, or BCB. The first via layer VIA1 may be a single layer (e.g., a single film) or a multilayered structure (e.g., a multilayer film) including a stacked structure (e.g., a stacked film) of different materials.

Figure 19:
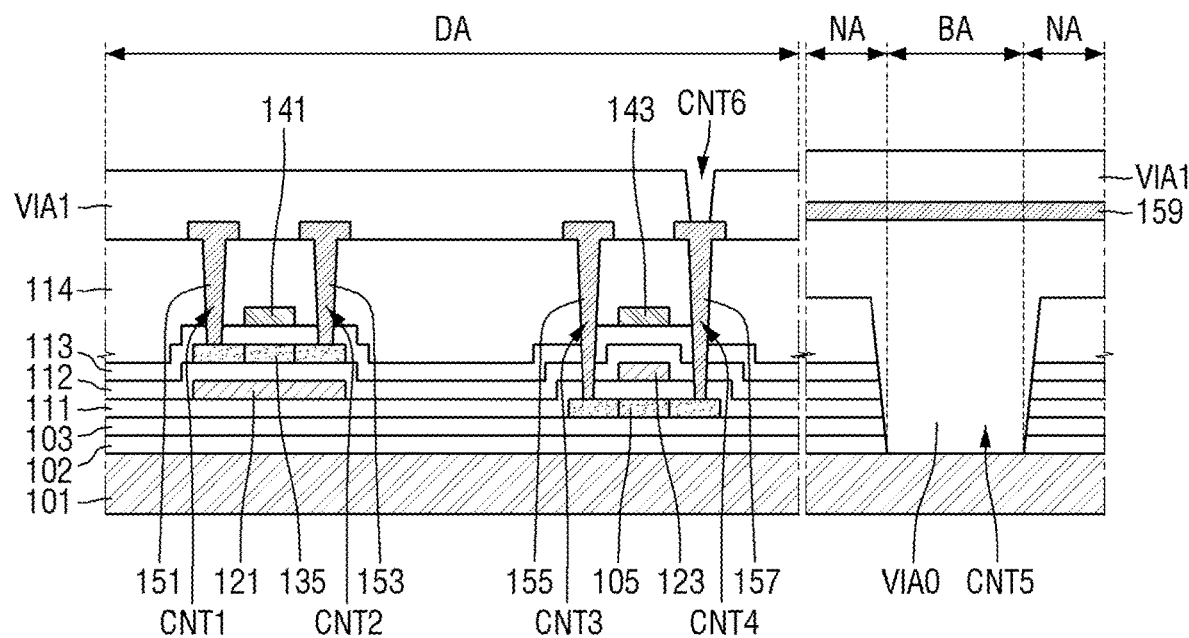

Referring to FIGS. 6 and 19 with reference to FIG. 5, the sixth contact hole CNT6 that extends (e.g., passes) through the first via layer VIA1 is formed.

The sixth contact hole CNT6 may be formed to extend (e.g., pass) through the first via layer VIA1 to expose an upper surface of the second source electrode 155 or an upper surface of the second drain electrode 157.

Figure 20:
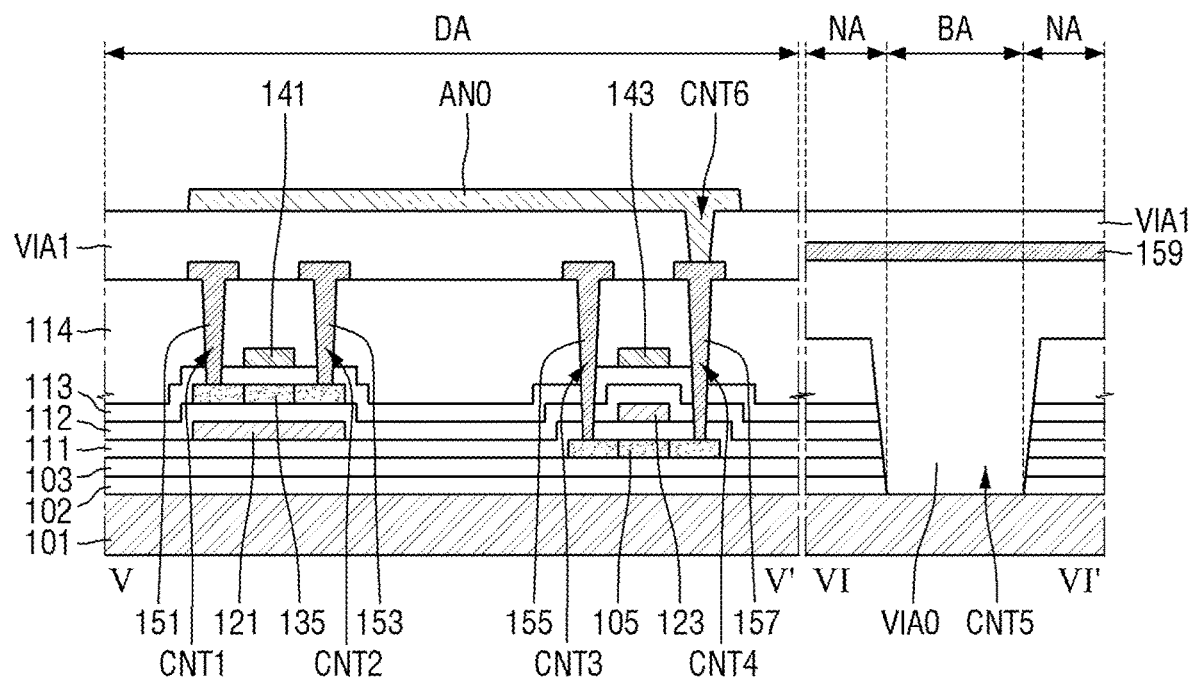

Referring to FIGS. 6 and 20 with reference to FIG. 5, the pixel electrode ANO is formed on the first via layer VIA1.

The pixel electrode ANO may be an anode. The pixel electrode ANO may be formed to be electrically connected to the second source electrode 155 or the second drain electrode 157 through the sixth contact hole CNT6 that extends (e.g., passes) through the first via layer VIA1. The pixel electrode ANO may be formed to be connected (e.g., directly connected) to the second source electrode 155 or the second drain electrode 157 through the sixth contact hole CNT6 without being connected to (e.g., without going through) the connection electrode (e.g., an intermediate connection electrode) or the like. The pixel electrode ANO may be formed separately for each pixel.

Figure 21:
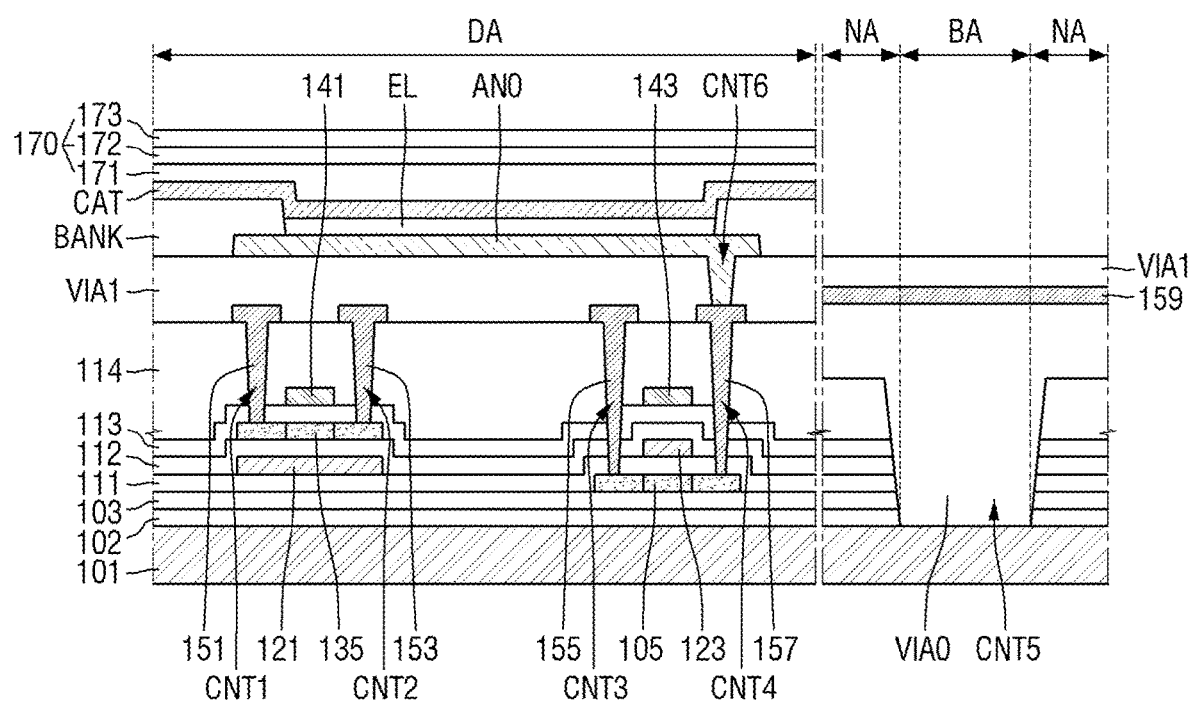

Referring to FIGS. 6 and 21 with reference to FIG. 5, the bank layer BANK is formed on the pixel electrode ANO. The bank layer BANK may be formed to partially expose the pixel electrode ANO. The bank layer BANK may include (e.g., be made of) an organic insulating material or an inorganic insulating material. For example, the bank layer BANK may be made of at least one selected from among a photoresist, a polyimide-based resin, an acrylic-based resin, a silicon compound, and a polyacrylic-based resin.

The organic layer EL may be formed on the pixel electrode ANO that is exposed by the bank layer BANK, and the cathode CAT may be formed on surfaces (e.g., entire surfaces) of the organic layer EL and the bank layer BANK. The cathode CAT may be a common electrode disposed on a plurality of pixels.

Hereinafter, display devices according to one or more other exemplary embodiments will be described. In the following exemplary embodiments, the same reference symbols denote the same or substantially the same components as those of the one or more exemplary embodiments described above, and thus, redundant descriptions thereof may not be repeated or may be simplified.

Figure 22:
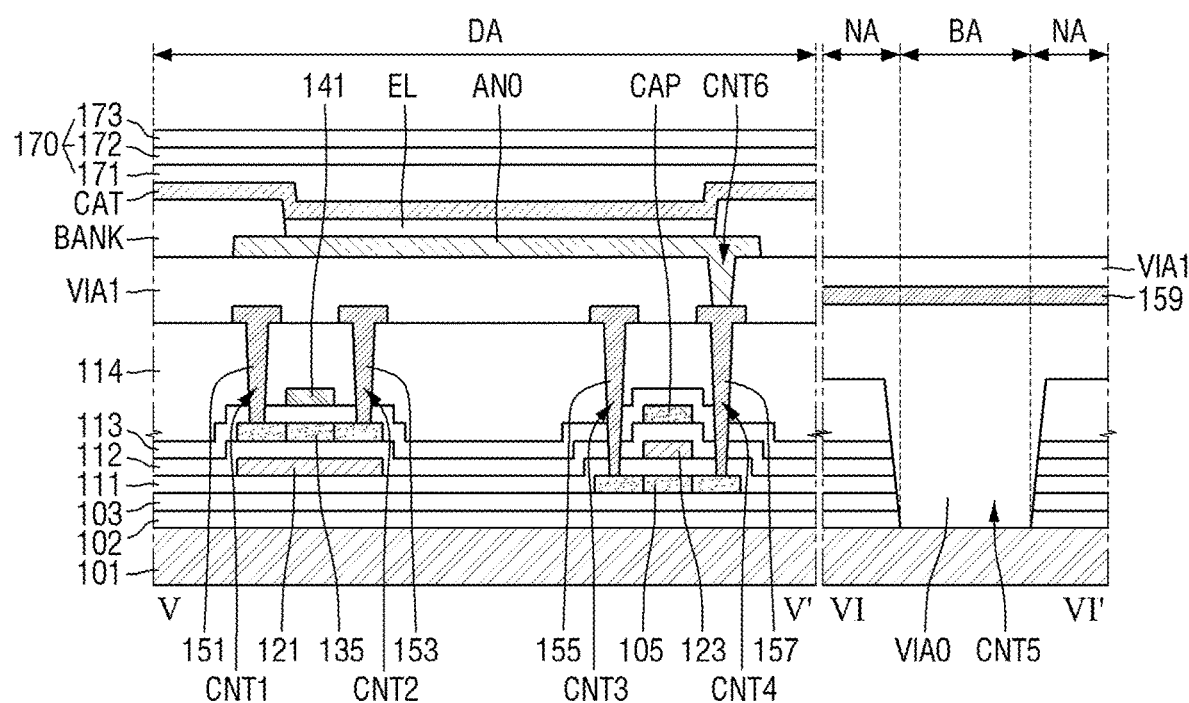
FIG. 22 shows cross-sectional views illustrating a display device according to another exemplary embodiment.

FIG. 22 shows cross-sectional views illustrating a display device according to another exemplary embodiment. For example, FIG. 22 shows cross-sectional views taken along the lines V-V' and VI-VI' of FIG. 3, according to another exemplary embodiment.

Referring to FIG. 22, a display device 2 according to the present exemplary embodiment is different from the display device 1 according to the one or more exemplary embodiments described above, in that the display device 2 further includes a cap conductive pattern CAP that is disposed between a second insulating layer 112 and a third insulating layer 113 at (e.g., in or on) a second region, and a second-second gate electrode 143 is omitted.

In more detail, the display device 2 may further include the cap conductive pattern CAP disposed between the second insulating layer 112 and the third insulating layer 113 at (e.g., in or on) the second region. In the display device 2 according to the present exemplary embodiment, the second-second gate electrode 143 may be omitted A capacitor may be formed from the cap conductive pattern CAP and a second-first gate electrode 123, with the second insulating layer 112 disposed therebetween.

The cap conductive pattern CAP is disposed on the same or substantially the same layer as that of the second semiconductor layer 135, and may be formed through the same or substantially the same process as that of the second semiconductor layer 135. The cap conductive pattern CAP may include (or be made of) the same or substantially the same material as that of the second semiconductor layer 135.

A capacitor may be formed from the cap conductive pattern CAP and the second-first gate electrode 123, with the second insulating layer 112 disposed therebetween.

In terms of a manufacturing method, an operation of forming the second semiconductor layer 135 on the second insulating layer 112 at (e.g., in or on) a first region may further include forming the cap conductive pattern CAP on the second insulating layer 112 at (e.g., in or on) the second region. The operation of forming the second semiconductor layer 135 on the second insulating layer 112 at (e.g., in or on) the first region and the operation of forming the cap conductive pattern CAP on the second insulating layer 112 at (e.g., in or on) the second region may be performed concurrently.

The display device 2 according to the present exemplary embodiment may further include the cap conductive pattern CAP that is disposed between the second insulating layer 112 and the third insulating layer 113 at (e.g., in or on) the second region, thereby increasing a capacitance of a driving transistor that is disposed at (e.g., in or on) the second region, for example, the first transistor T1. In more detail, according to the present exemplary embodiment, the cap conductive pattern CAP and the second-first gate electrode 123 may be disposed with the second insulating layer 112 disposed therebetween. On the other hand, in the display device 1 according to one or more of the above-described exemplary embodiments, the second-second gate electrode 143 and the second-first gate electrode 123 may be disposed with the second insulating layer 112 and the third insulating layer 113 disposed therebetween. In other words, according to the present exemplary embodiment, a distance between the cap conductive pattern CAP and the second-first gate electrode 123 may be reduced when compared to the distance between the second-second gate electrode 143 and the second-first gate electrode 123 of the display device 1 described above. Capacitance may be affected by an opposite area and a separation distance between conductors. As in the present exemplary embodiment, a separation distance between the cap conductive pattern CAP and the second-first gate electrode 123 may be reduced, such that the capacitance (e.g., the overall capacitance) of the first transistor T1 may be increased.

Figure 23:
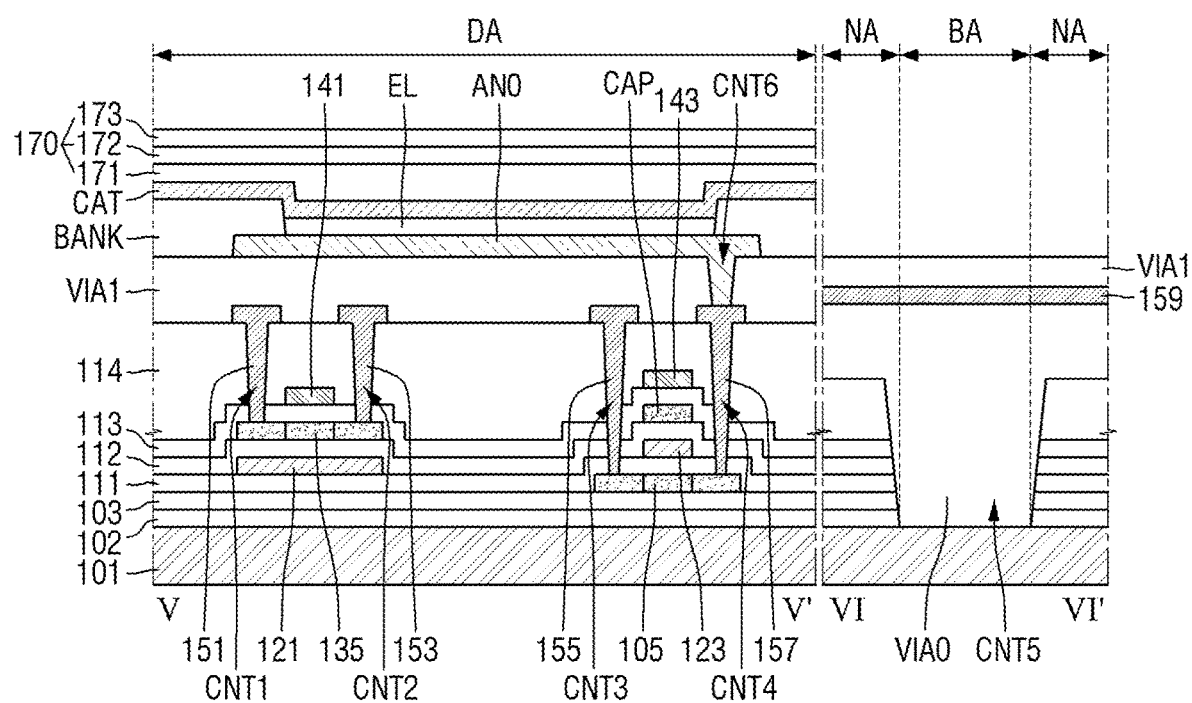
FIG. 23 shows cross-sectional views illustrating a display device according to still another exemplary embodiment.

FIG. 23 shows cross-sectional views illustrating a display device according to still another exemplary embodiment. For example, FIG. 23 shows cross-sectional views taken along the lines V-V' and VI-VI' of FIG. 3, according to still another exemplary embodiment.

Referring to FIG. 23, a display device 3 according to the present exemplary embodiment is different from the display device 1 of FIG. 5, in that the display device 3 further includes a cap conductive pattern CAP disposed between a second insulating layer 112 and a third insulating layer 113 at (e.g., in or on) a second region.

A capacitor (e.g., a first capacitor) may be formed from the cap conductive pattern CAP and a second-first gate electrode 123, with the second insulating layer 112 disposed therebetween. A capacitor (e.g., a second capacitor) may be formed from the cap conductive pattern CAP and a second-second gate electrode 143 with the third insulating layer 113 disposed therebetween.

The cap conductive pattern CAP has been described with reference to FIG. 22, and thus, redundant descriptions thereof may not be repeated.

In the display device 3 according to the present exemplary embodiment, the capacitor may be formed from the cap conductive pattern CAP and the second-first gate electrode 123 with the second insulating layer 112 disposed therebetween, and the capacitor may be formed from the cap conductive pattern CAP and the second-second gate electrode 143 with the third insulating layer 113 disposed therebetween, thereby increasing capacitance of the first transistor Ti.

According to one or more exemplary embodiments of the display device and the method of manufacturing the display device, the number of masks may be reduced, thereby reducing process costs and increasing process efficiency.

However, the aspects and features of the present disclosure described herein are not restricted (or limited) to the exemplary embodiments set forth herein, and other aspects and features may be included within the spirit and scope of the present disclosure.

Although one or more exemplary embodiments of the present disclosure have been described with reference to the accompanying drawings, it should be understood that the embodiments described herein should be considered in a descriptive sense only and not for purposes of limitation. Accordingly, it will be understood by those skilled in the art to which the present disclosure pertains that various changes in form and details may be made therein, without departing from the spirit and scope of the present disclosure as defined by the following claims and their equivalents.

What is claimed is:

1. A display device comprising:
a base substrate having a display region and a non-display region adjacent to the display region, the display region including a first region and a second region;
a first semiconductor layer at the second region of the base substrate, the first semiconductor layer comprising polysilicon;
a first insulating layer on the first semiconductor layer;
a first conductive layer on the first insulating layer, the first conductive layer comprising a bottom gate electrode at the first region and a second-first gate electrode at the second region;
a second insulating layer on the first conductive layer;
a second semiconductor layer on the second insulating layer at the first region, the second semiconductor layer comprising an oxide;
a third insulating layer on the second semiconductor layer;
a second conductive layer on the third insulating layer, the second conductive layer comprising a top gate electrode at the first region and a second-second gate electrode at the second region;
a fourth insulating layer on the second conductive layer; and
a third conductive layer on the fourth insulating layer, the third conductive layer comprising a first source electrode, a first drain electrode, a second source electrode, and a second drain electrode, each of the first source electrode and the first drain electrode being connected to the second semiconductor layer, and each of the second source electrode and the second drain electrode being connected to the first semiconductor layer,
wherein the second-first gate electrode and the second-second gate electrode overlap with each other at the second region with the second and third insulating layers therebetween.

2. The display device of claim 1, wherein the bottom gate electrode and the top gate electrode are electrically connected to each other.

3. The display device of claim 1, further comprising:
a first via layer on the third conductive layer; and
a pixel electrode on the first via layer,
wherein the pixel electrode is directly connected to the second source electrode or the second drain electrode.

4. A display device comprising:
a base substrate having a display region and a non-display region adjacent to the display region, the display region including a first region and a second region;
a first semiconductor layer at the second region of the base substrate, the first semiconductor layer comprising polysilicon;
a first insulating layer on the first semiconductor layer;

a first conductive layer on the first insulating layer, the first conductive layer comprising a bottom gate electrode at the first region and a second-first gate electrode at the second region;

a second insulating layer on the first conductive layer;

a second semiconductor layer on the second insulating layer at the first region, the second semiconductor layer comprising an oxide;

a third insulating layer on the second semiconductor layer;

a second conductive layer on the third insulating layer, the second conductive layer comprising a top gate electrode at the first region and a second-second gate electrode at the second region;

a fourth insulating layer on the second conductive layer; and a third conductive layer on the fourth insulating layer, the third conductive layer comprising a first source electrode, a first drain electrode, a second source electrode, and a second drain electrode, each of the first source electrode and the first drain electrode being connected to the second semiconductor layer, and each of the second source electrode and the second drain electrode being connected to the first semiconductor layer, wherein:

the non-display region includes a bending region at a side of the display region;

the first to fourth insulating layers are configured to expose an upper surface of the base substrate at the bending region;

the bending region comprises a bending via layer on the base substrate, and a connection electrode on the bending via layer; and the third conductive layer further comprises the connection electrode.

5. The display device of claim 1, further comprising a cap conductive pattern at the second region between the second insulating layer and the third insulating layer, wherein the cap conductive pattern, the second-first gate electrode, and the second insulating layer that is between the cap conductive pattern and the second-first gate electrode defines a capacitor.

6. The display device of claim 5, wherein the cap conductive pattern comprises the same material as that of the second semiconductor layer.

7. The display device of claim 1, further comprising a cap conductive pattern at the second region between the second insulating layer and the third insulating layer, wherein the second-second gate electrode and the cap conductive pattern defines a capacitor.

8. The display device of claim 7, wherein the bottom gate electrode and the second-first gate electrode comprise the same material.

9. The display device of claim 8, wherein the top gate electrode and the second-second gate electrode comprise the same material.

10. The display device of claim 1, wherein the oxide of the second semiconductor layer comprises at least one oxide selected from among gallium indium zinc oxide (G-I—Z—O), zinc (Zn), indium (In), gallium (Ga), tin (Sn), cadmium (Cd), germanium (Ge), hafnium (Hf), and a combination thereof.

11. The display device of claim 1, wherein the first semiconductor layer, the second-first gate electrode, the second source electrode, and the second drain electrode define a driving transistor, and wherein the second semiconductor layer, the bottom gate electrode, the top gate electrode, the first source electrode, and the first drain electrode define a switching transistor.

* * * * *